United States Patent [19]
Iwata

[11] Patent Number: 6,107,863
[45] Date of Patent: Aug. 22, 2000

[54] CHARGE PUMP CIRCUIT AND LOGIC CIRCUIT

[75] Inventor: Toru Iwata, Osaka, Japan

[73] Assignee: Matsushita Electric Industrial Co., Ltd., Osaka, Japan

[21] Appl. No.: 09/017,633

[22] Filed: Feb. 3, 1998

[30] Foreign Application Priority Data

Feb. 3, 1997 [JP] Japan .................................. 9-020684

[51] Int. Cl.⁷ .................................................. G06F 11/16
[52] U.S. Cl. ............................................................ 327/536
[58] Field of Search ................................. 327/530, 534, 327/535, 536, 537

[56] References Cited

U.S. PATENT DOCUMENTS

| | | | |
|---|---|---|---|
| 5,126,590 | 6/1992 | Chern | 307/296.2 |
| 5,196,996 | 3/1993 | Oh | 363/60 |
| 5,266,842 | 11/1993 | Park | 307/296.2 |
| 5,343,088 | 8/1994 | Jeon | 307/296.2 |
| 5,444,362 | 8/1995 | Chung et al. | 323/313 |
| 5,502,415 | 3/1996 | Matsui et al. | 327/536 |
| 5,521,547 | 5/1996 | Tsukada | 327/537 |
| 5,677,645 | 10/1997 | Merritt | 327/536 |

FOREIGN PATENT DOCUMENTS

| | | |
|---|---|---|
| 05062477 | 3/1993 | Japan . |
| 06014529 | 1/1994 | Japan . |
| 06197003 | 7/1994 | Japan . |
| 07327357 | 12/1995 | Japan . |

*Primary Examiner*—Jeffrey Zweizig
*Attorney, Agent, or Firm*—Renner, Otto, Boisselle & Sklar LLP

[57] ABSTRACT

A charge pump circuit includes a first pump section. The first pump section includes a first switching element having a first control terminal, a second switching element having a second control terminal, and a node which is respectively coupled to the first switching element and the second switching element. The charge pump circuit converts an input voltage to an output voltage by complementary action of the first switching element and the second switching element responsive to a first driving voltage signal and a second driving voltage signal, respectively, the output voltage being output via an output terminal. The node is electrically isolated from the first control terminal and the second control terminal.

4 Claims, 21 Drawing Sheets

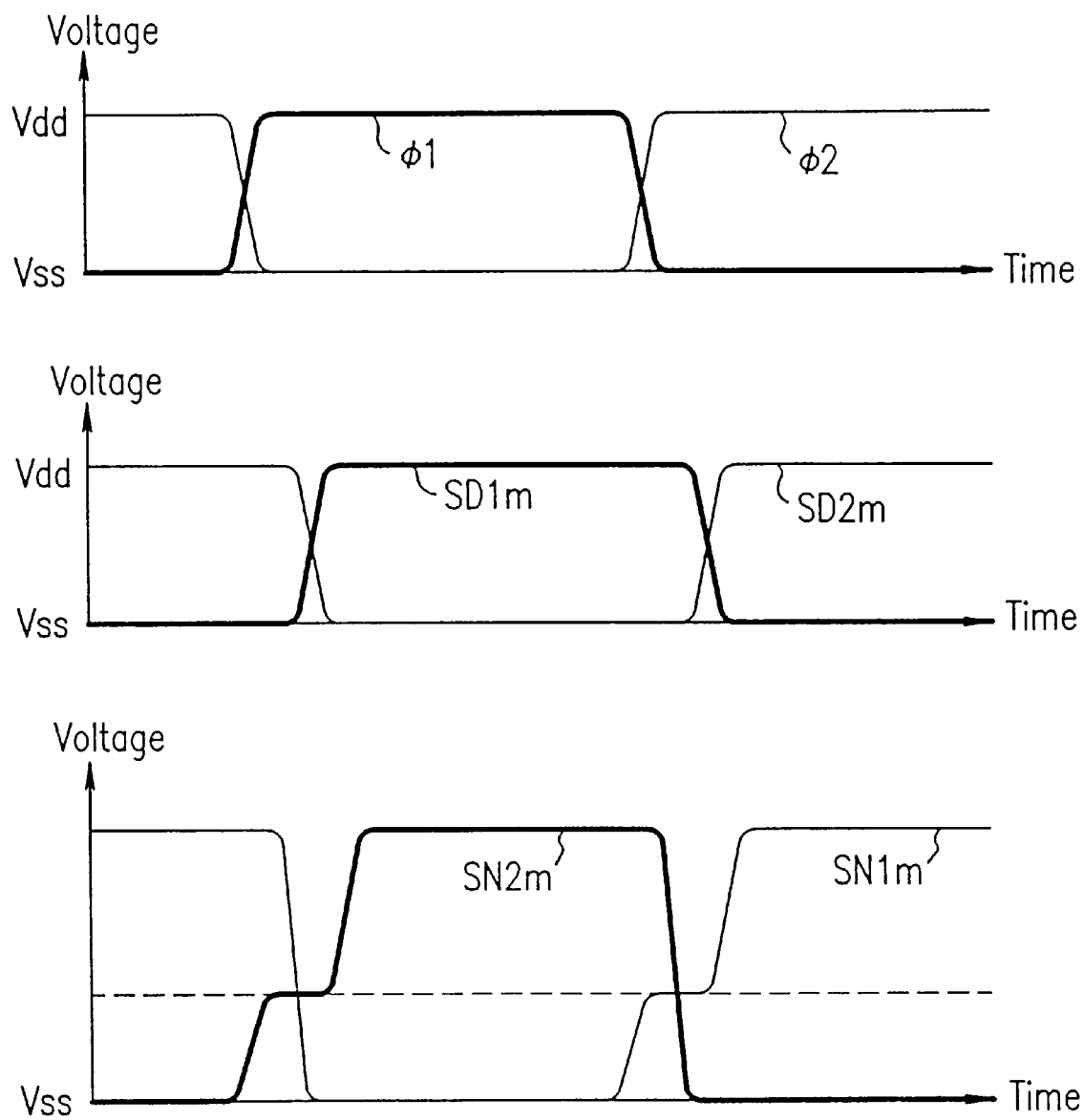

CHARGE PUMP CIRCUIT AND LOGIC CIRCUIT

BACKGROUND OF THE INVENTION

1. Field of the Invention

The present invention relates to a charge pump circuit, and in particular to a charge pump circuit in a semiconductor integrated circuit (IC) for generating an elevated or lowered power level from an externally supplied power voltage.

2. Description of the Related Art

DRAMs (dynamic random access memories) and flash memories require elevated or lowered power levels due to their structures or the need to increase their operation speeds. It adds to the value of a chip as a product if elevated or lowered power levels can be generated by an internal power circuit incorporated in the chip.

A typical method for generating elevated or lowered power levels on a chip employs a charge pump circuit. A charge pump circuit on an IC usually incorporates transistors as rectification elements.

For example, a charge pump circuit disclosed in Japanese Laid-Open Publication No. 6-14529 has been proposed. Hereinafter, this conventional technique will be described with reference to the accompanying figures.

FIG. 18 is a circuit diagram illustrating the charge pump circuit described in the aforementioned literature. FIG. 19 is a diagram illustrating the operational waveforms of the charge pump circuit shown in FIG. 18. As shown in FIG. 18, the charge pump circuit includes rectification transistors Q1 and Q2, precharge transistors Q3 and Q4, and capacitors C1 and C2.

An input voltage Vdd is converted to an output voltage Vpp by the complementary action of the rectification transistor Q1 and the precharge transistor Q3 and the rectification transistor Q2 and the precharge transistor Q4 in response to a signal φ1 (having a first driving potential) and a signal φ2 (having a second driving potential).

Specifically, as the signal φ1 goes HIGH, the potential of a node N1 (coupled to a gate of the transistor Q1) is increased by the capacitor C1. The charge emerging at the node N1 is maintained at 2 Vdd while the signal φ1 is at the H (high) level (i.e., the Vdd level in this conventional example), and the potential of the gate of the transistor Q1 is sufficiently increased. Then, the charge at the node N1 is transferred to an output node Npp.

However, with respect to the precharge transistor Q3, for example, the charge emerging at a node N2 is output to the output node Npp and therefore decreases over time. Especially in the case where the input voltage Vdd is low, the gate potential of the precharge transistor Q3 is not sufficiently increased, so that the precharge transistor Q3 is incapable of sufficiently precharging the node N1 at Vdd. Thus, the potential of the node N1 cannot not be increased to 2Vdd responsive to the driving of the capacitor C1. As a result, the charge pump circuit outputs a charge (Vpp) which is smaller than the ideal charge, thereby resulting in a large loss in the voltage conversion process.

Even if the charge pump circuit operates in an ideal manner, the potential amplitudes of the transistors Q1 to Q4 will at best be equal to or lower than Vdd (because the gate potential is between Vdd and 2 Vdd). Therefore, under low voltage conditions where the input voltage Vdd is less than 1V, the on-off current difference of each of the transistors Q1 to Q4 becomes small. As a result, the charge stored in the capacitors C1 and C2 cannot be rapidly transferred to the output node Npp.

Furthermore, a timing control circuit TMG and driver circuits IV1 and IV2 for driving the charge pump circuit cannot rapidly drive a charge pump circuit (which constitutes a substantial load) under the low voltage conditions of the input voltage Vdd being less than 1 V. This results in the problem of an insufficient current being output from the charge pump circuit.

SUMMARY OF THE INVENTION

A charge pump circuit according to the present invention includes a first pump section, the first pump section including: a first switching element having a first control terminal; a second switching element having a second control terminal; and a node which is respectively coupled to the first switching element and the second switching element, wherein the charge pump circuit converts an input voltage to an output voltage by complementary action of the first switching element and the second switching element responsive to a first driving voltage signal and a second driving voltage signal, respectively, the output voltage being output via an output terminal, and the node is electrically isolated from the first control terminal and the second control terminal.

In one embodiment of the invention, the first switching element includes a first rectification transistor and a second rectification transistor; the first control terminal includes a first rectification control terminal and a second rectification control terminal; the second switching element includes a first precharge transistor and a second precharge transistor; the second control terminal includes a first precharge control terminal and a second precharge control terminal; the node includes a first node and a second node; the first node is coupled to a first capacitor and the second node is coupled to a second capacitor; while the charge pump circuit is in a first state, the first rectification transistor supplies charge stored in the first capacitor to the output terminal and the second precharge transistor supplies the input voltage to the second capacitor; while the charge pump circuit is in a second state, the second rectification transistor supplies charge stored in the second capacitor to the output terminal and the first precharge transistor supplies the input voltage to the first capacitor; and the first node is electrically isolated from the second precharge control terminal, and the second node is electrically isolated from the first precharge control terminal.

In another embodiment of the invention, the charge pump circuit further includes a second pump section for driving the first control terminal and the second control terminal; the second pump section includes a first subtransistor, a second subtransistor, a first subcapacitor, and a second subcapacitor; the first subtransistor and the second subtransistor have a first subcontrol terminal and a second subcontrol terminal, respectively; a first group of control terminals includes the first rectification control terminal, the second precharge control terminal, and the second subcontrol terminal receives the first driving voltage signal via the first subcapacitor; and a second group of control terminals includes the second rectification control terminal, the first precharge control terminal, and the first subcontrol terminal receives the second driving voltage signal via the second subcapacitor.

In still another embodiment of the invention, the first group of control terminals and the second group of control terminals each receives a voltage having an amplitude which is greater than an amplitude of the input voltage.

In still another embodiment of the invention, the second pump section further includes means for generating a first voltage for ensuring that the first switching element and the second switching element are in a substantially OFF state; the first group of control terminals receives a second voltage in the first state and receives the first voltage in the second state, the second voltage being higher than the input voltage; and the second group of control terminals receives the first voltage in the first state and receives the second voltage in the second state.

In still another embodiment of the invention, the second pump section further includes means for generating a first voltage for ensuring that the first switching element and the second switching element are in a substantially OFF state; the first group of control terminals receives a second voltage in the first state and receives the first voltage in the second state, the second voltage being lower than a ground potential; and the second group of control terminals receives the first voltage in the first state and receives the second voltage in the second state.

In still another embodiment of the invention, the first group of control terminals receives a first voltage in the first state and receives a second voltage in the second state, the first voltage being higher than the input voltage, and the second voltage being substantially equal to the input voltage; and the second group of control terminals receives the second voltage in the first state and receives the first voltage in the second state.

In still another embodiment of the invention, the first group of control terminals receives a first voltage in the first state and receives a second voltage in the second state, the first voltage being lower than a ground potential, and the second voltage being substantially equal to the input voltage; and the second group of control terminals receives the second voltage in the first state and receives the first voltage in the second state.

In still another embodiment of the invention, the first switching element includes a rectification transistor; the first control terminal includes a rectification control terminal; the second switching element includes a precharge transistor; the second control terminal includes a precharge control terminal; the node is coupled to a capacitor; while the charge pump circuit is in a first state, the rectification transistor supplies charge stored in the capacitor to the output terminal; while the charge pump circuit is in a second state, the precharge transistor supplies the input voltage to the capacitor; and the node is electrically isolated from the precharge control terminal.

A logic circuit according to the present invention includes: a voltage conversion circuit for converting a first voltage to a second voltage; a first circuit section operating by utilizing the first voltage as a power voltage; and a second circuit section operating by utilizing the second voltage as a power voltage, wherein the first circuit section has a power consumption larger than a power consumption of the second circuit section.

In one embodiment of the invention, a switching frequency in the first circuit section is higher than a switching frequency in the second circuit section.

In another embodiment of the invention, the first circuit section drives a load larger than a load driven by the second circuit section.

In still another embodiment of the invention, the first voltage is elevated to the second voltage by the voltage conversion circuit.

In still another embodiment of the invention, the first voltage is lowered to the second voltage by the voltage conversion circuit.

In still another embodiment of the invention, the voltage conversion circuit is a charge pump circuit including a first pump section, the first pump section including a first switching element having a first control terminal, a second switching element having a second control terminal, and a node which is coupled to the first switching element and the second switching element; the charge pump circuit converts an input voltage to an output voltage by complementary action of the first switching element and the second switching element responsive to a first driving voltage signal and a second driving voltage signal, respectively, the output voltage being output via an output terminal; and the node is electrically isolated from the first control terminal and the second control terminal.

In still another embodiment of the invention, the second circuit section includes a logic circuit section, the first circuit section includes a driver section for driving a load, and the driver section is coupled to an output of the logic circuit section.

In still another embodiment of the invention, the driver section includes a first transistor having a source node, the first voltage being supplied to the source node of the first transistor; the logic circuit section includes a second transistor having a source node, the second voltage being supplied to the source node of the second transistor, the first transistor having a threshold value which is lower than a threshold value of the second transistor.

Thus, the invention described herein makes possible the advantages of (1) providing a charge pump circuit incurring a small loss during the voltage conversion process; and (2) providing a charge pump circuit capable of rapidly supplying an elevated or lowered power level under low voltage conditions of an input voltage being 1 V or less.

These and other advantages of the present invention will become apparent to those skilled in the art upon reading and understanding the following detailed description with reference to the accompanying figures.

BRIEF DESCRIPTION OF THE DRAWINGS

FIG. 8E is a waveform diagram illustrating the operational waveforms of the subpump section shown in FIG. 8D.

DESCRIPTION OF THE PREFERRED EMBODIMENTS

Hereinafter, examples of the charge pump circuit according to the present invention will be described with reference to the accompanying figures. In the figures, like numerals represent like constituent elements.

Throughout the specification, the term "voltage" and the term "potential" are interchangeably employed where appropriate.

Example 1

Figure 1:
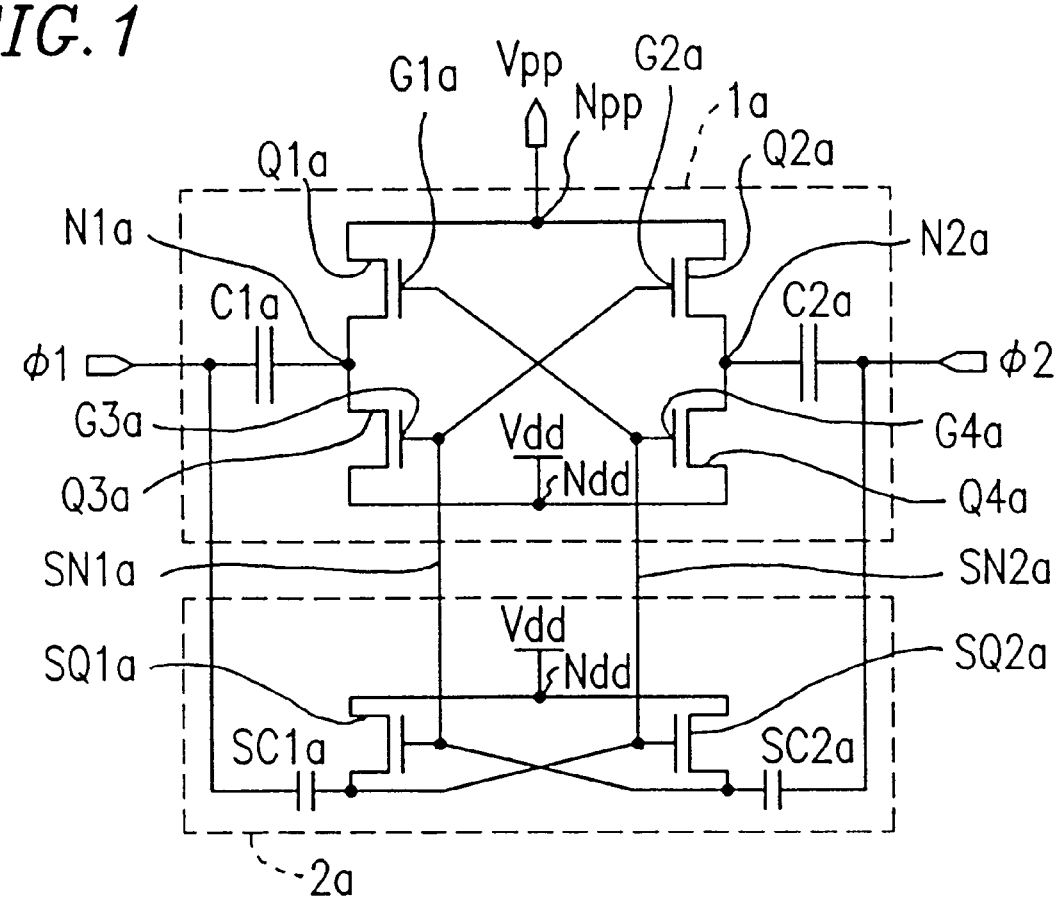
FIG. 1 is a circuit diagram illustrating a charge pump circuit according to Example 1 of the present invention.

FIG. 1 is a circuit diagram illustrating a charge pump circuit according to Example 1 of the present invention. The charge pump circuit includes a main pump section 1a and a subpump section 2a.

The main pump section 1a includes main capacitors C1a and C2a, rectification transistors Q1a and Q2a, and precharge transistors Q3a and Q4a. The subpump section 2a includes subcapacitors SC1a and SC2a and transistors SQ1a and SQ2a.

The main pump section 1a and the subpump section 2a each receive and are driven by a signal φ1 (having a first driving potential) and a signal φ2 (having a second driving potential). The signals φ1 and φ2 are preferably square wave signals having a phase difference of 180° (i.e., having opposite phases).

The subpump section 2a outputs signals SN1a and SN2a (whose phases are in synchronization with those of the signals φ1 and φ2, respectively) to the main pump section 1a. An input voltage Vdd (a positive voltage) is applied at a node Ndd.

Figure 2:
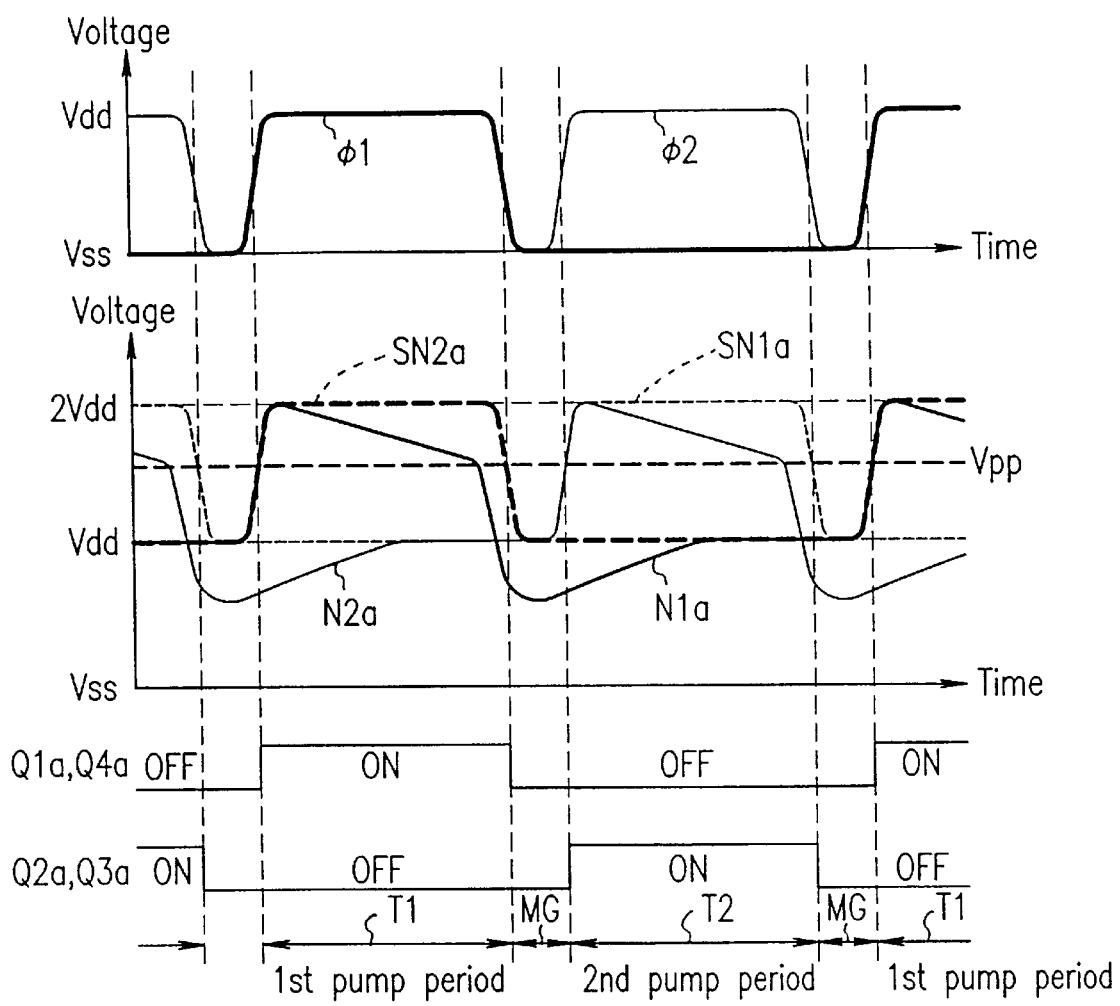
FIG. 2 is a waveform diagram illustrating the operational waveforms of the charge pump circuit shown in FIG. 1.

FIG. 2 is a waveform diagram illustrating the operational waveforms of the charge pump circuit shown in FIG. 1. The operation of the charge pump circuit of the present example will be described with reference to FIGS. 1 and 2.

As the signal φ1 goes HIGH to initiate a first pump period T1, the potential of the node N1a is increased due to the capacitance of the capacitor C1a, which has been driven by the signal φ1. The node N2a is precharged by the transistor SQ1a at the voltage Vdd. Therefore, as the signal φ1 goes HIGH so that the subcapacitor SC1a is driven, the potential of the node N2a is increased from Vdd to a value substantially equal to 2 Vdd.

It should be noted that, unlike in a conventional charge pump circuit, a gate G4a of the precharge transistor Q4a is not coupled to the node N1a during the first pump period T1 (i.e., while the precharge transistor Q4a is in an ON state). As a result, the voltage 2 Vdd (or a first voltage which is higher than the input voltage Vdd) is applied to the precharge transistor Q4a without any substantial decrease in its potential. Thus, the node N2 can be sufficiently precharged.

The potential 2 Vdd is also applied to a gate G1a of the rectification transistor Q1a throughout the first pump period T1. As a result, the charge emerging at the node N1a is output to an output node Npp without any substantial loss.

The first pump period T1 terminates as the signal φ1 goes LOW. Once the potential of the signal φ1 goes LOW, the voltage Vdd (or a second voltage which is substantially equal to the input voltage Vdd) is applied to the gates G1a and G4a of the transistors Q1a and Q4a, respectively, so as to place the transistors Q1a and Q4a in an OFF state.

In order to prevent a reverse flow of charge, it is ensured that the transistors Q1a and Q4a are completely off before the second signal φ2 goes HIGH to initiate the second pump period T2. Specifically, a predetermined period MG (defining an OFF/ON margin time) elapses before the second signal φ2 goes HIGH.

The potential elevation operation can be achieved even if the OFF/ON margin is zero or smaller than zero (as in the case where the ON period of the transistors Q1a and Q4a overlap the ON period of the transistors Q2a and Q3a), although resulting in a decrease in the potential elevation efficiency (defined as the ratio of the output charge amount to the input charge amount).

Once the signal φ2 goes HIGH, the capacitors C2a and SC2a are driven, and the potentials of the nodes N2a and SN1a are increased to place the transistors Q2a and Q3a in an ON state. The charge emerging at the node N2a is output to the output node Npp via the rectification transistor Q2a.

The node N1a is precharged at the Vdd level via the precharge transistor Q3a. The second pump period T2 terminates as the signal φ2 goes LOW. After an ON/OFF margin period MG, the signal φ1 again goes HIGH to initiate the first pump period T1 once again.

Figure 18:
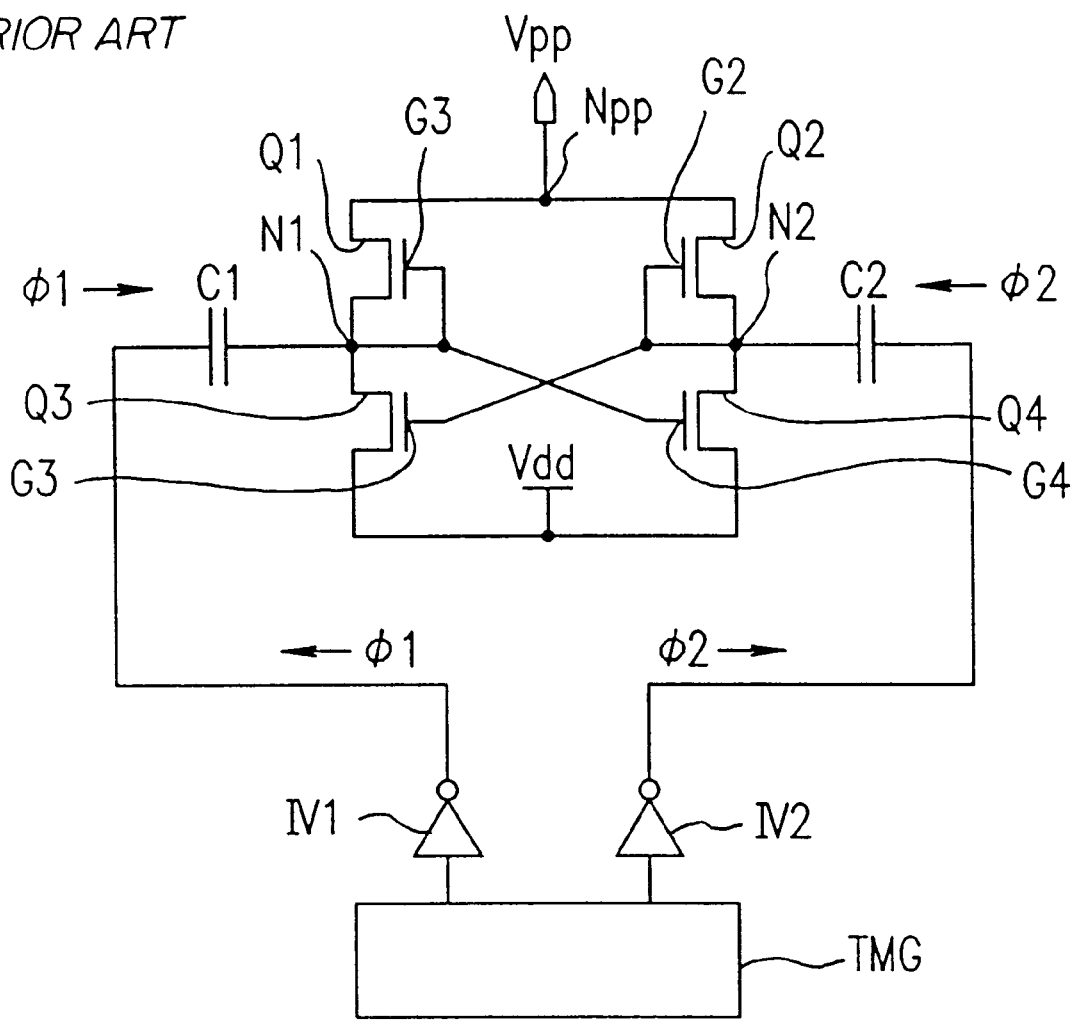
FIG. 18 is a circuit diagram illustrating a conventional charge pump circuit.
Figure 19:
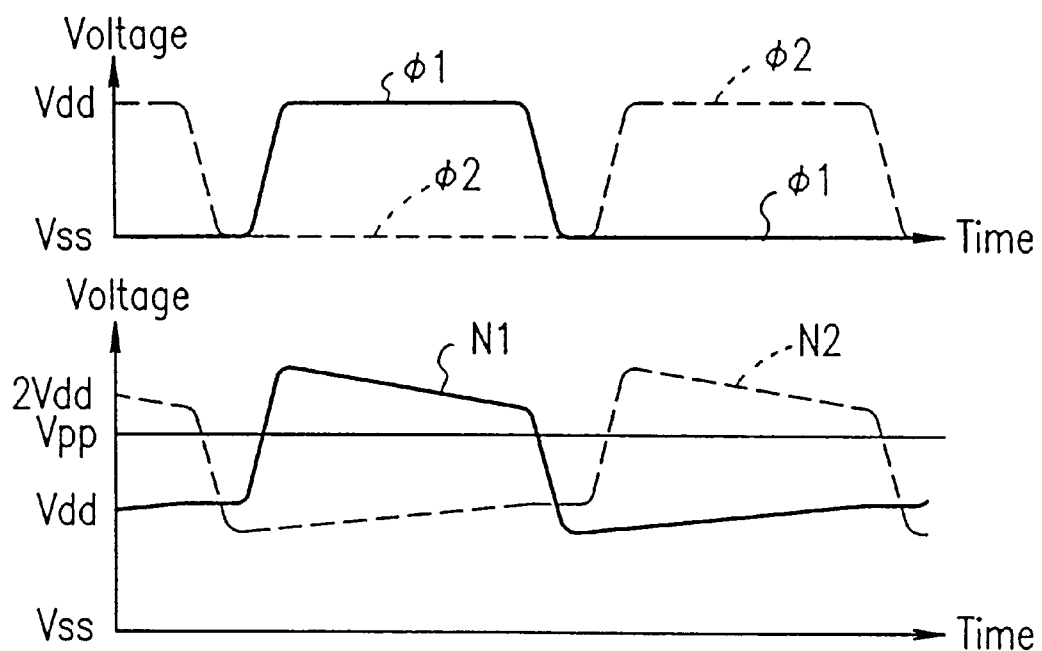
FIG. 19 is a waveform diagram illustrating the operational waveforms of the charge pump circuit shown in FIG. 18.

In the conventional charge pump circuit shown in FIG. 18, the gates G3 and G4 of the precharge transistors Q3 and Q4 are coupled to the output node Npp via the nodes N2 and N1, which causes the potentials of the nodes N2 and N1 to decrease from within the vicinity of 2 Vdd toward Vpp. As a result, in the case where the input voltage Vdd is low, the precharge transistors Q3 and Q4 cannot sufficiently precharge the nodes N1 and N2. This results in a low elevation efficiency.

In the present example, on the other hand, the subpump section 2a controls the gates G1a and G2a of the rectification transistors Q1a and Q2a and the gates G3a and G4a of the precharge transistors Q3a and Q4a.

In the present example, the respective gates G1a, G2a, G3a, and G4a of the rectification transistors Q1a, Q2a, Q3a, and Q4a can be isolated from the nodes N2a and N1a and the output node Npp. As a result, the potentials of the gates G1a, G2a, G3a, and G4a do not substantially decrease over time. Thus, an elevated power level can be highly efficiently provided in a low voltage operation with a low input voltage Vdd.

The subpump section 2a must have a smaller driving power than that of the main pump section 1a. For example, the subcapacitors SC1a and SC2a preferably have capacitance values which are about 1/10 of those of the main capacitors C1a and C2a, respectively.

The waveforms shown in FIG. 2 illustrate an equilibrium state where the output current (Npp) of the charge pump circuit is balanced with the load current output from the output node Npp. During the initial activation of the circuit or when the load increases, the potential of the output node Npp becomes lower than that in an equilibrium state. As a result, the waveforms associated with the nodes N1a and N2a will shift toward lower potentials.

Figure 3:
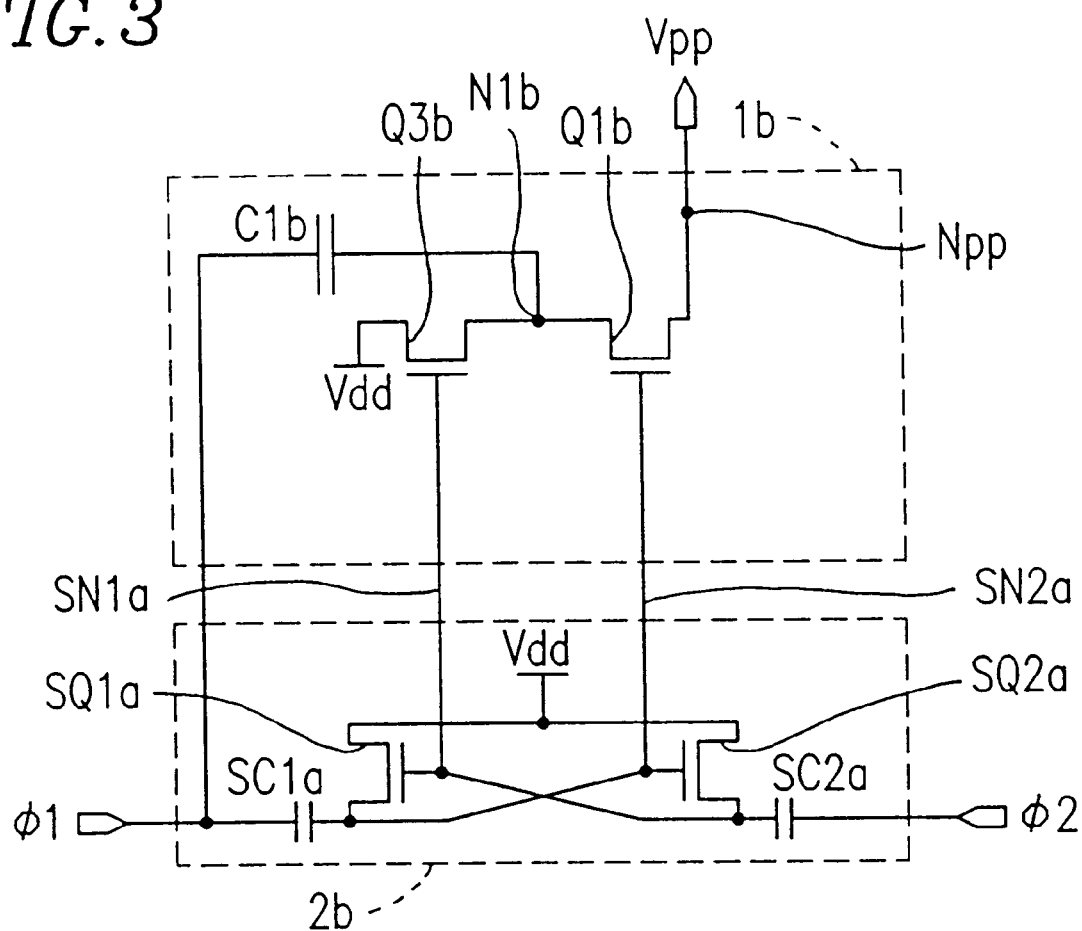
FIG. 3 is a circuit diagram illustrating a variant of the charge pump circuit shown in FIG. 1.

FIG. 3 is a circuit diagram illustrating a variant of the charge pump circuit shown in FIG. 1. The charge pump circuit in FIG. 3 illustrates only one side of the entire structure of the charge pump circuit in FIG. 1 for simplicity.

In the charge pump circuit of FIG. 1, the main pump section 1a includes two capacitors C1a and C2a which are driven in a complementary manner.

On the other hand, in the charge pump circuit of FIG. 3, the main pump section 1b includes and drives one main capacitor C1b. The main pump section 1b further includes a rectification transistor Q1b and a precharge transistor Q3b.

Figure 4:
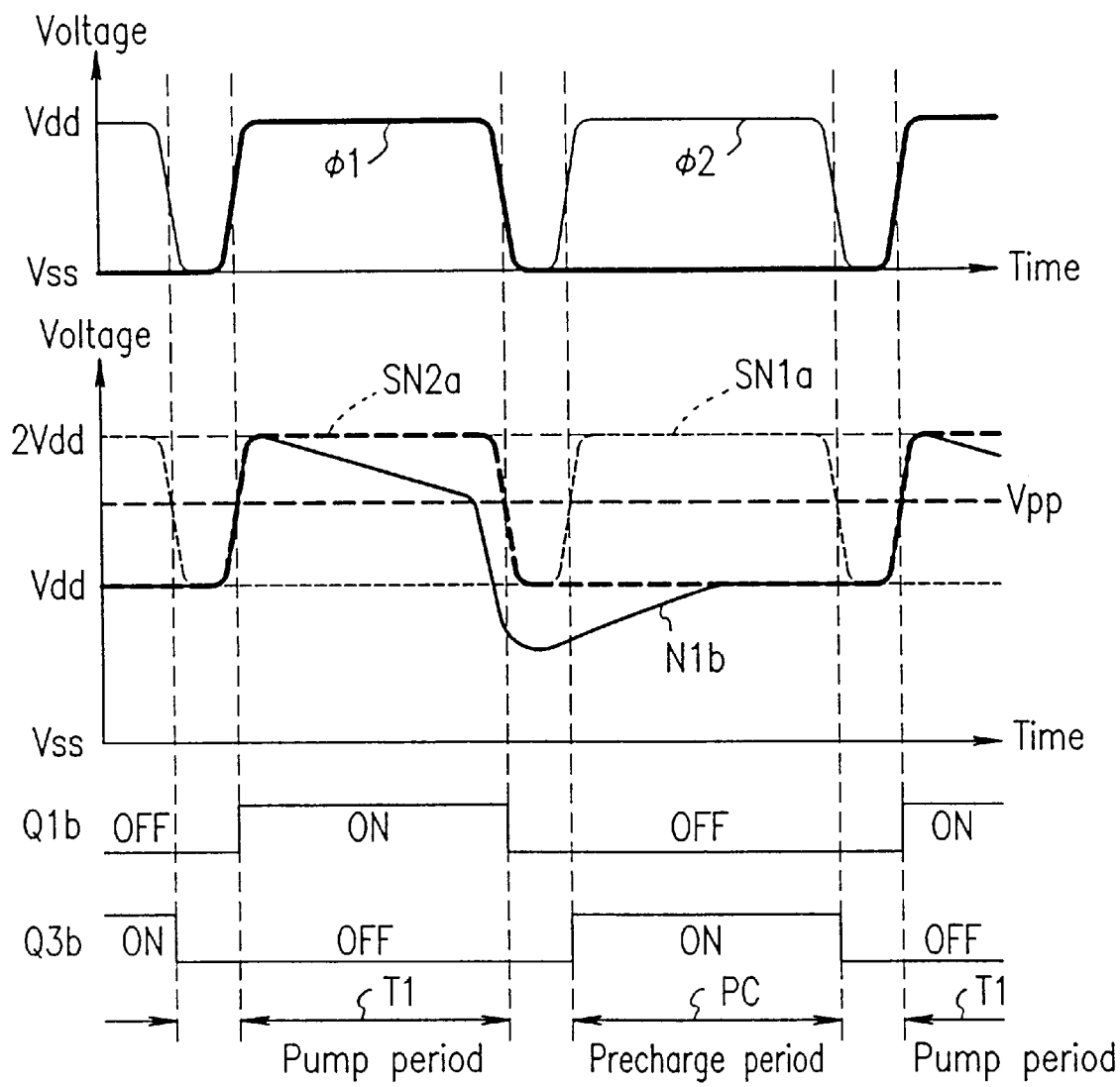
FIG. 4 is a waveform diagram illustrating the operational waveforms of the charge pump circuit shown in FIG. 3.

FIG. 4 is a waveform diagram illustrating the operational waveforms of the charge pump circuit shown in FIG. 3. As shown in FIG. 4, the charge pump circuit of FIG. 3 operates with a precharge period PC between two consecutive pump periods T1. As a result, the potential of the output node Npp has a larger variation than in the charge pump circuit of FIG. 1.

Figure 5:
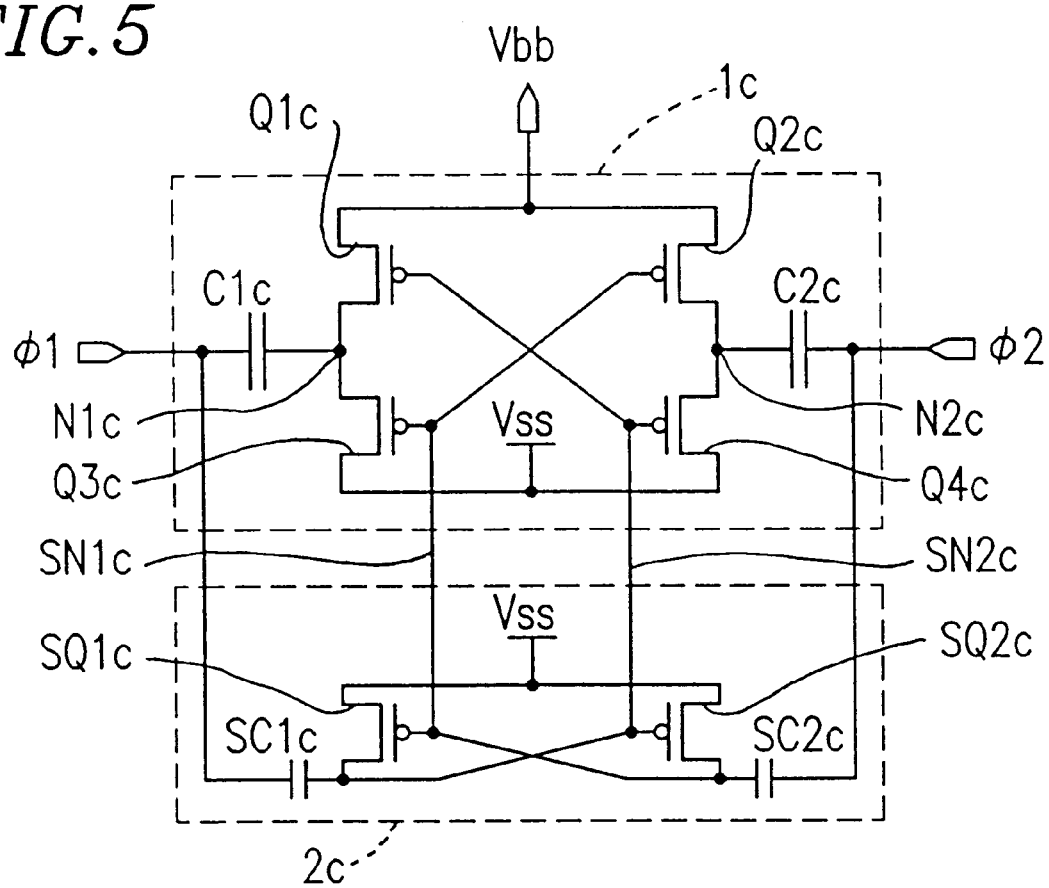
FIG. 5 is a circuit diagram illustrating a charge pump circuit according to the present invention for generating a lowered power level.
Figure 6:
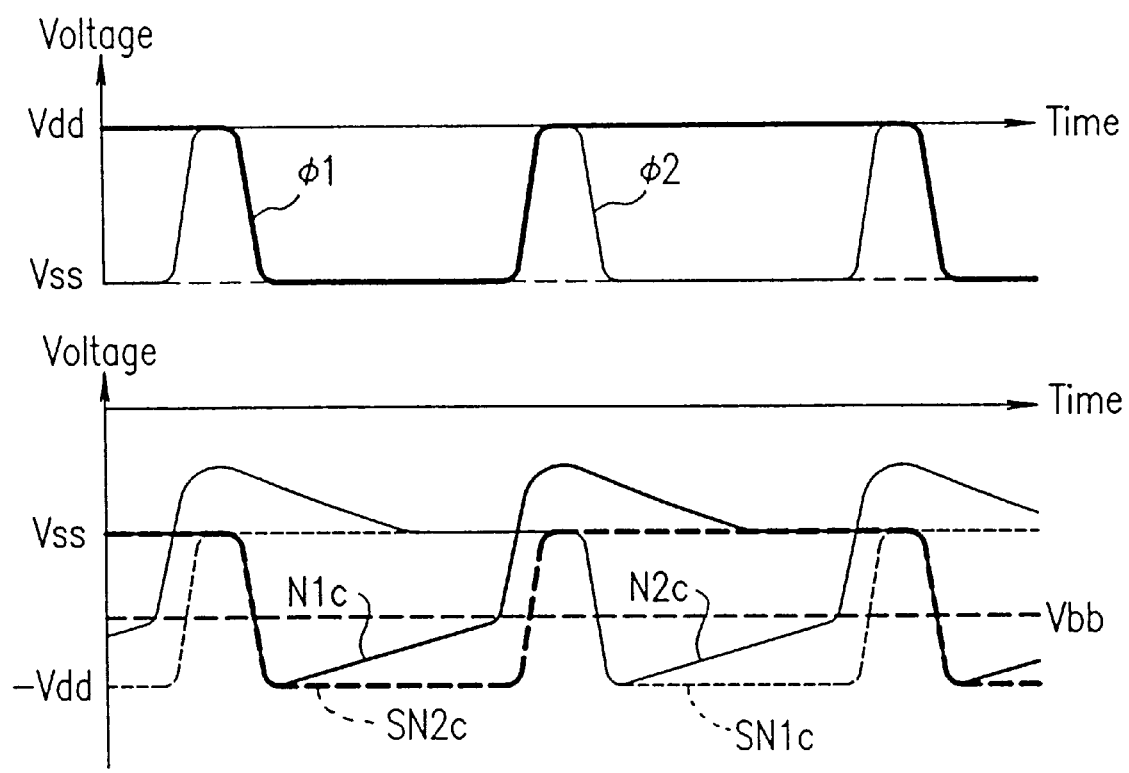
FIG. 6 is a waveform diagram illustrating the operational waveforms of the charge pump circuit shown in FIG. 5.

FIG. 5 is a circuit diagram illustrating a charge pump circuit according to the present invention for generating a lowered power level. FIG. 6 is a waveform diagram illustrating the operational waveforms of the charge pump circuit shown in FIG. 5.

The charge pump circuit of FIG. 5 differs from the charge pump circuit of FIG. 1 in that (1) PMOS transistors, instead of NMOS transistors, are employed for the rectification transistors Q1c and Q2c and precharge transistors Q3c and Q4c; and (2) the supplied input voltage is Vss, as opposed to Vdd.

Although a case is illustrated where Vss is substantially zero volts, Vss is not limited to zero volts but can be predetermined at any suitable voltage.

The present example illustrates a case where Vss is substantially equal to the ground potential (e.g., GND). Alternatively, Vss can be any predetermined value other than the ground potential.

The transistors Q1c, Q4c, and SQ2c each receive a voltage −Vdd (or a first voltage which is lower than the ground potential Vss) when the signal φ1 goes LOW, and receive a voltage Vss (or a second voltage which is substantially equal to the input voltage Vss) when the signal φ1 goes HIGH.

In any one of the following Examples, a charge pump circuit for generating a lowered power level is realized, instead of a charge pump circuit for generating an elevated power level, by exchanging the polarities of the transistors (NMOS or PMOS) and the polarities of the supply power voltage (Vdd or Vss) as exemplified in FIGS. 5 and 6.

EXAMPLE 2

Figure 7A:
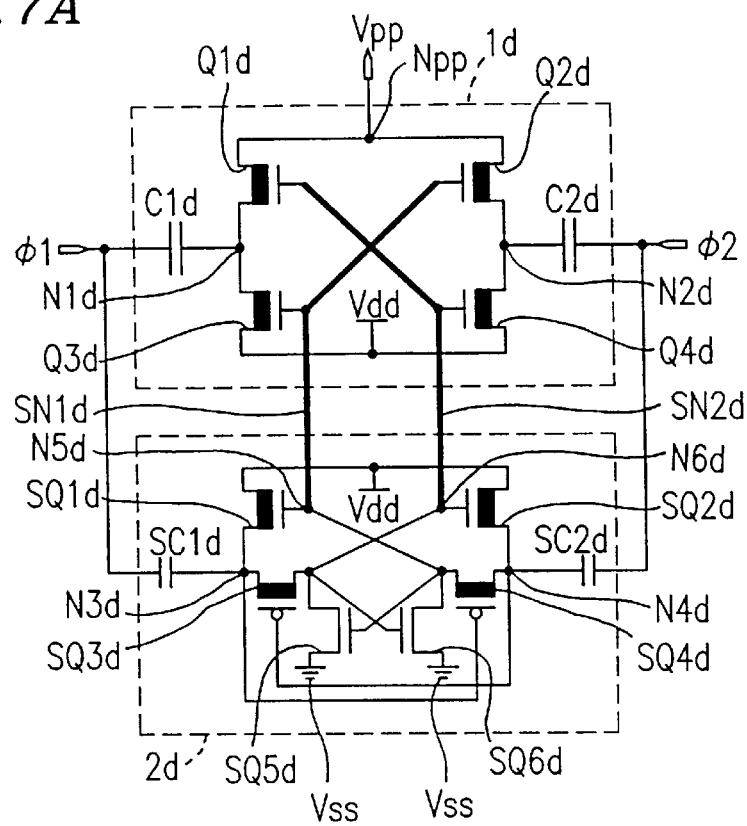
FIG. 7A is a circuit diagram illustrating a charge pump circuit according to Example 2 of the present invention.

FIG. 7A is a circuit diagram illustrating a charge pump circuit according to Example 2 of the present invention.

In the charge pump circuit of Example 1 illustrated in FIG. 1, the amplitude of the voltage generated by the subpump section (between Vdd and 2Vdd) is Vdd. Therefore, the voltage amplitudes at the gates G1a and G2a of the rectification transistors Q1a and Q2a and the gates G3a and G4a of the precharge transistors Q3a and Q4a are no more than Vdd. As a result, in the case where the supplied input voltage Vdd is much lower than 1V (e.g., 0.5V), the charge cannot be rapidly transferred to the output node Npp.

In the present example, as shown in FIG. 7A, a voltage between Vss (or a first voltage substantially equal to a voltage for ensuring that the rectification transistors Q1d and Q2d and the precharge transistors Q3d and Q4d are in a complete OFF state) and 2 Vdd (or a second voltage which is higher than the input voltage Vdd) is generated by the subpump section 2d.

The rectification transistors Q1d and Q2d, the precharge transistors Q3d and Q4d, and the subtransistors SQ1d and SQ2d receive a voltage having the amplitude from Vss to 2 Vdd, which is larger than the amplitude of the input voltage Vdd. The voltage Vss (or the first voltage) sufficiently approximates a predetermined voltage for ensuring that the rectification transistors Q1d and Q2d, the precharge transistors Q3d and Q4d and the subtransistors SQ1d and SQ2d are in an OFF state. The example herein illustrates a case where the voltage Vss is substantially zero volts.

The present example illustrates a case where Vss (or the first voltage) is substantially equal to the ground potential (e.g., GND). Alternatively, Vss can be any predetermined value other than the ground potential.

As a result, the voltage amplitudes of the gate potentials of the rectification transistors Q1d and Q2d, the precharge transistors Q3d and Q4d and the subtransistors SQ1d and SQ2d are increased to 2Vdd.

The source potentials of the rectification transistors Q1d and Q2d and the precharge transistors Q3d and Q4d are at least equal to or greater than Vdd. Therefore, the gates and the sources of the NMOS transistors Q1d, Q2d, Q3d, and Q4d are in a reverse bias state when Vss is applied to their respective gates. This further ensures the complete OFF state of the transistors Q1d, Q2d, Q3d, and Q4d.

A leakage current (or subthreshold current) of a transistor can be expressed by the following equation:

$$I_{leak} = r(W/L) \cdot 10^{-(VT/S)}$$

where the respective alphabetical letters have the following definitions:

r: constant;
W: transistor gate width;
L: gate length;
S: slope factor (i.e., the slope of a drive current I with respect to Vgs in the subthreshold region); and
Vt: threshold value.

Since the value of the slope factor S is in the range of 70 to 100 mV (note that it takes a minus value in the case of PMOS transistors), the leakage current will increase by one order of magnitude as the threshold value Vt decreases by 0.1V.

The driving current Ids can be expressed by the following equation:

$$Ids = \beta(Vgs-Vt)^\alpha$$

The driving current Ids is a so-called saturation voltage, which does not belong to the subthreshold region.

Specifically, a leakage current of a transistor is determined by the value (Vgs−Vt) during its OFF state. If the Vss potential level can be generated in the subpump section 2d, the value of Vgs during an OFF state equals −Vdd. This allows the threshold value Vt of the transistors Q1d, Q2d, Q3d, and Q4d to be set at a value which is lower by Vdd than that used in the structure of FIG. 1 (where Vgs=0V).

Thus, according to the present example, the threshold voltages of the rectification transistors Q1d and Q2d and the precharge transistors Q3d and Q4d can be prescribed at greatly reduced values. Moreover, when the transistors are in an ON state, (Vgs−Vt) becomes larger than that in the structure of FIG. 1. As a result, a rapid transfer of charge is realized.

The subpump section 2d shown in FIG. 7A receives signals φ1 and φ2 and outputs subpump output signals SN1d and SN2d for controlling the gates of the rectification transistors Q1d and Q2d and the precharge transistors Q3d and Q4d of the main pump section 1d. The subpump section 2d includes: precharge transistors SQ1d and SQ2d; transistors SQ4d and SQ3d for achieving isolation between nodes N1d and N4d and isolation between nodes N2d and N3d, respectively; and transistors SQ5d and SQ6d for discharging the voltages of the signals SN1d and SN2d to Vss. The main pump section 1d has the same structure as that of the main pump 1a of Example 1 illustrated in FIG. 1 except that the transistors Q1d, Q2d, Q3d, and Q4d have low threshold values.

Figure 7B:
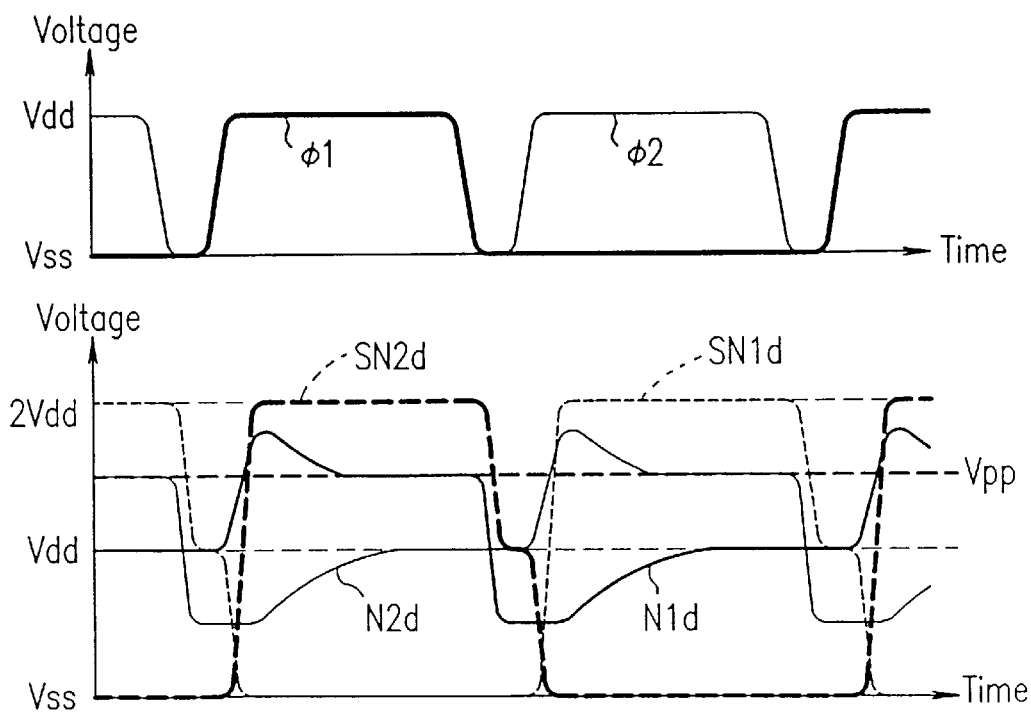
FIG. 7B is a waveform diagram illustrating the operational waveforms of the charge pump circuit shown in FIG. 7A.

FIG. 7B is a waveform diagram illustrating the operational waveforms of the charge pump circuit shown in FIG. 7A. As the signal 41 goes HIGH after the signal φ2 goes LOW, the voltage of the node N3d, which has been precharged at Vdd, is increased to 2 Vdd while the gate potential of the transistor SQ3d is at Vdd. As a result, the charge at the node N3d is transferred to the node N6d via the transistor SQ3d. Thus, the potential of the node N6d is increased.

Once the potential of the node N6d is increased, the transistor SQ6d is turned ON so that the potential of the node N5d equals Vss. Since the potential of the node N5d equals Vss, the transistor SQ5d is turned OFF, so that the potential of the node N6d is increased to a value which is substantially equal to 2 Vdd.

There is a time lag between the moment at which the potential of the node N6d is increased and the moment at which the transistor SQ5d is turned OFF. Therefore, it would seem that the potential of the node N6d may not necessarily be increased to 2 Vdd.

However, the elevation loss at the node N6d due to the transistor SQ5d becomes negligible where the threshold value of the transistor SQ5d is sufficiently high. The reason is that, since the voltage of the signal φ2 has been decreased, the potential of the node N5d is as low as almost Vdd, thereby resulting in a low voltage operation (e.g., Vdd= 0.5V).

Even in the case where the voltage Vdd is higher than 0.5V, the elevation loss at the node N6d will be still small if the transistor SQ5d is "small-sized" relative to the charge amount emerging at the node N3d and only a small charge amount is lost via the transistor SQ5d. The subpump section 2d is only required to have a driving power sufficient for controlling the gates of the transistors Q1d, Q2d, Q3d, and Q4d of the main pump section 1d. Therefore, the loss due to the time lag before the transistor SQ5d becomes OFF is negligible to the efficiency of the overall charge pump circuit of FIG. 7A.

As the signal φ2 goes HIGH after the signal φ1 goes LOW, the voltage of the node N5d is increased. As a result, the transistor SQ5d is turned ON so that the potential of the node N6d is lowered to Vss. Since the potential of the node N4d is increased to 2 Vdd, the transistor SQ3d is turned OFF, and the nodes N6d and N3d are electrically isolated from each other. The potential of the node N3d never becomes smaller than the precharge potential Vdd.

Thus, according to the present example, the gate-source voltage of the PMOS transistors Q3d and Q4d becomes −Vdd in an ON state and Vdd in an OFF state. As a result, the voltage amplitudes of the respective transistors are increased to 2 Vdd, which allows the use of low-threshold transistors. As a result, a rapid transfer of charge is realized.

With respect to the source-drain voltages of the PMOS transistors Q3d and Q4d, the node N3d has a higher potential than that of the node N6d and the node N4d has a higher potential than that of the node N5d in almost all time periods. Therefore, if the well potentials of the PMOS transistors Q3d and Q4d are equal to the potentials of the nodes N3d and N4d, respectively, no "latch up" phenomenon occurs.

By generating a voltage between Vss and 2 Vdd in the subpump section as described above, an elevated power level can be efficiently provided under low voltage conditions associated with a low input voltage Vdd.

Figure 8A:
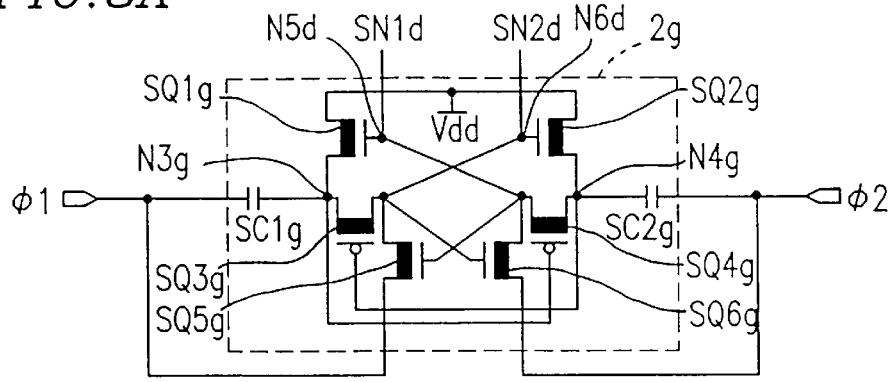
FIG. 8A is a circuit diagram illustrating an exemplary subpump section in the charge pump circuit according to the present invention.
Figure 8B:
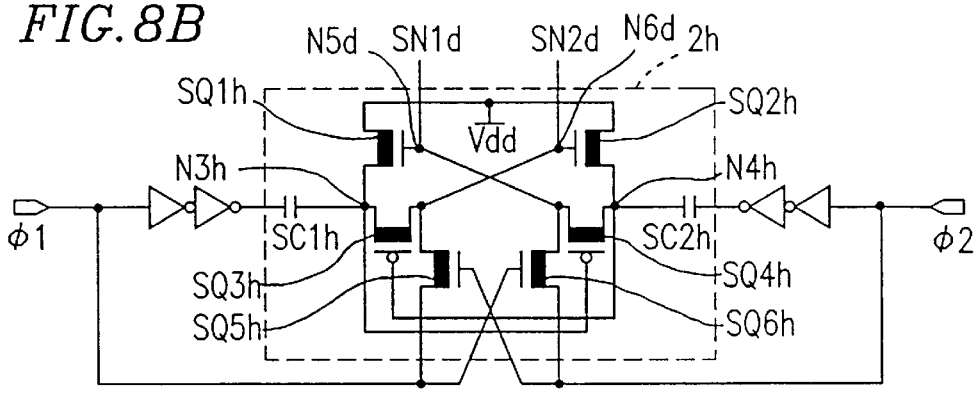
FIG. 8B is a circuit diagram illustrating another exemplary subpump section in the charge pump circuit according to the present invention.
Figure 8C:
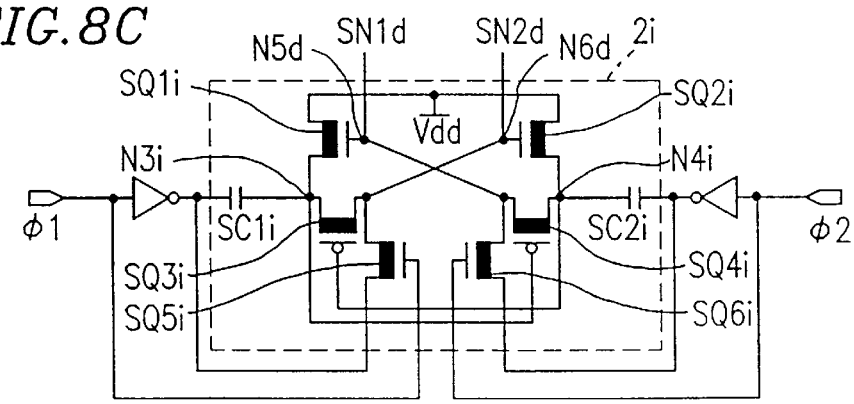
FIG. 8C is a circuit diagram illustrating still another exemplary subpump section in the charge pump circuit according to the present invention.

FIGS. 8A to 8C are circuit diagrams illustrating exemplary subpump sections in the charge pump circuit according to the present invention. In FIGS. 8A to 8C, the signals SN1d and SN2d are subpump output signals for respectively controlling the gates of the rectification transistors Q1d and Q2d and the precharge transistors Q3d and Q4d of the main pump section 1d (not shown), for example.

In FIG. 8A, transistors SQ1g and SQ2g are precharge transistors. The transistors SQ3g and SQ4g are transistors for maintaining the lowest voltages of the nodes N5d and N6d at Vdd. Transistors SQ5g and SQ6g are transistors for discharging the voltages of the signals SN1d and SN2d to Vss.

As the signal φ1 goes HIGH, the node N3g is increased by Vdd from the precharge voltage Vdd to 2 Vdd. Concurrently, the signal φ1 goes LOW, so that the node N4g equals the precharge potential Vdd. As a result, the transistor SQ3g is turned ON so that 2 Vdd emerges at the node N5d. The gate of the transistor SQ5g is coupled to the node N5d.

The source of the transistor SQ5g is coupled to the signal 42, thereby discharging the charge at the node N6d (which is coupled to the drain of the transistor SQ5g) to Vss. Thus, the potential of the node N6d is Vss.

At this time, the potential Vss of the node N6d is applied to the gate of the transistor SQ6g (which is in an OFF state) while the potential Vdd of the signal φ2 is applied to the source of the transistor SQ6g. As a result, the gate-source voltage Vgs is reverse biased. This makes it possible to minimize the leakage current even in the case where low-threshold transistors are employed for the transistors SQ5g and SQ6g. Therefore, it is possible to rapidly discharge the output signals SN1d and SN2d to Vss under low voltage conditions where the input voltage Vdd is less than 1V, for example.

FIGS. 8B and 8C are circuit diagrams illustrating variants of the subpump section shown in FIG. 8A. In both structures, a reverse bias voltage Vdd is supplied to the transistors SQ5*h* and SQ6*h* or SQ5*i* and SQ6*i* (which are transistors for applying Vss to the nodes N1*d* and N2*d*) while the transistors SQ5*h* and SQ6*h* or SQ5*i* and SQ6*i* are in an OFF state.

Therefore, it is possible to reduce the threshold values of the transistors SQ5*h*, SQ6*h*, SQ5*i*, and SQ6*i*. Thus, a rapid elevation operation can be achieved under low voltage conditions where the input voltage Vdd is less than 1V, for example.

In the structure shown in FIG. 8B, subcapacitors SC1*h* and SC2*h* of a subpump section 2*h* are driven by signals φ1 and φ2 via drivers (which are invertors in the illustrated example).

The potentials of the nodes N5*d* and N6*d* are decreased to Vss before they are increased to 2 Vdd. This provides for a larger OFF/ON margin between the moment at which the transistors SQ3*h* and SQ4*h* are turned OFF and the moment at which the capacitors SC1*h* and SC2*h* are driven. Furthermore, the transistors SQ1*h* and SQ3*h* are prevented from being simultaneously turned ON, and the transistors SQ2*h* and SQ4*h* are prevented from being simultaneously turned ON. As a result, the leak from the output node Npp (not shown) to the input voltage Vdd is substantially eliminated. The structure shown in FIG. 8C also provides these advantages.

Similarly, the potentials of the nodes N5*d* and N6*d* are decreased to Vss before the potentials of the nodes N3*h* and N4*h* are decreased to Vdd. Thus, by coupling the wells of the PMOS transistors SQ3*h* and SQ4*h* to the nodes N3*h* and N4*h*, respectively, the well potentials are prevented from becoming lower than the source potentials or the drain potentials. This provides for an improved latch up resistance.

Figure 8D:
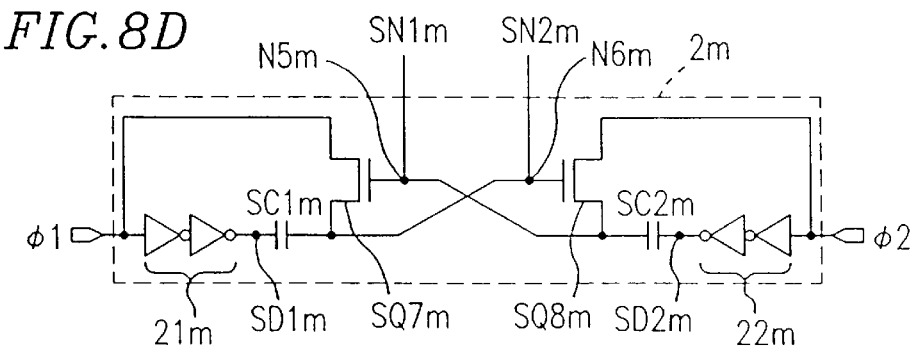
FIG. 8D is a circuit diagram illustrating still another exemplary subpump section in the charge pump circuit according to the present invention.

FIG. 8D is a circuit diagram illustrating another variation of the subpump section in the charge pump circuit according to the present invention. FIG. 8E is a waveform diagram illustrating the operational waveforms of the subpump section shown in FIG. 8D.

The aforementioned subpump section incorporates PMOS transistors to achieve isolation between the precharge nodes and Vss. However, a structure incorporating no PMOS transistors is preferable because the use of PMOS transistors in a structure where both the well potentials and the source potentials are subject to change may result in a latch up.

In the subpump section 2*m* shown in FIG. 8D, the precharging function and the function of discharging to Vss are performed with some time lag therebetween, whereby it becomes possible to perform both functions (i.e., precharging and discharging to Vss) solely based on NMOS transistors.

The operation of the subpump section 2*m* is described with reference to FIG. 8E. At a point immediately before the signal φ1 goes LOW, nodes N6*m* and N5*m* are at the HIGH level and the LOW level, respectively, and transistors SQ8*m* and SQ7*m* are in an ON state and an OFF state, respectively. As the signal φ1 goes LOW (i.e., signal φ2 goes HIGH), Vdd is applied to the node N5*m* via the transistor SQ8*m*. As a result, the transistor SQ7*m* is turned ON, and the potential of the node N6*m* equals Vss.

As the potential of the node N6*m* equals Vss, the transistor SQ8*m* is turned OFF, so that the potential of the node N5*m* is increased to no more than about the threshold value Vt. Thereafter, the potential of the signal SD2*m*, which has been delayed by a delay circuit 22*m*, is increased, and the potential of the node N5*m* is increased to (Vt+Vdd). Vss is still applied to the node N6*m* after the signal SD1*m* is decreased.

In accordance with this structure, it is possible to generate a voltage between Vss and (Vdd+Vt) in the subpump section without employing PMOS transistors. As a result, a power elevation function can be achieved without causing latch up problems.

EXAMPLE 3

According to Example 2, it is possible to efficiently operate the charge pump circuit itself even under low voltage conditions associated with a low input voltage Vdd. However, it is difficult to rapidly operate the control circuit for generating the signals φ1 and φ2 and the driver circuits under low voltage conditions where Vdd=about 0.5V. This makes it difficult to obtain a large current from the charge pump circuit because the output current of the charge pump circuit depends on the capacitance of the pump capacitors and the driving frequency of the pump.

Figure 9:
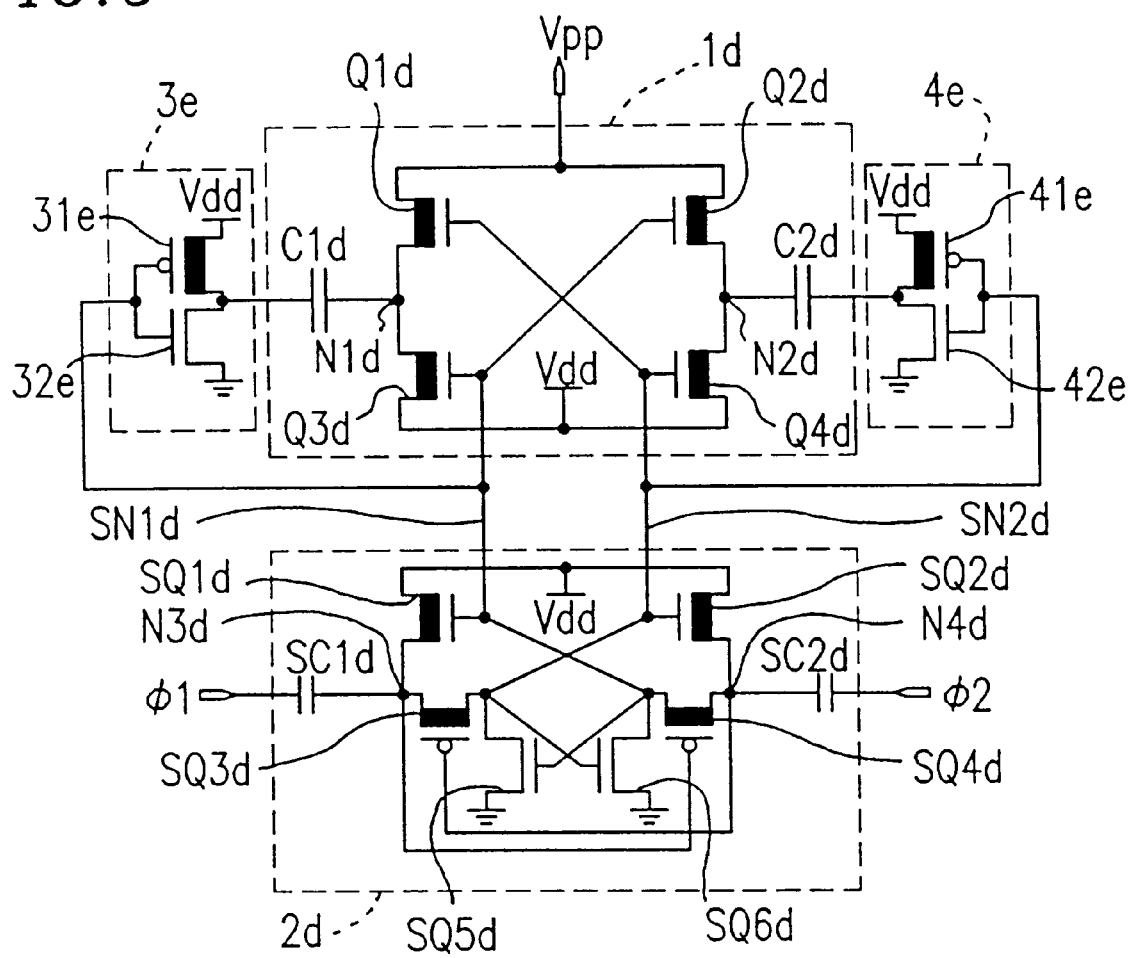
FIG. 9 is a circuit diagram illustrating a charge pump circuit according to Example 3 of the present invention.
Figure 10:
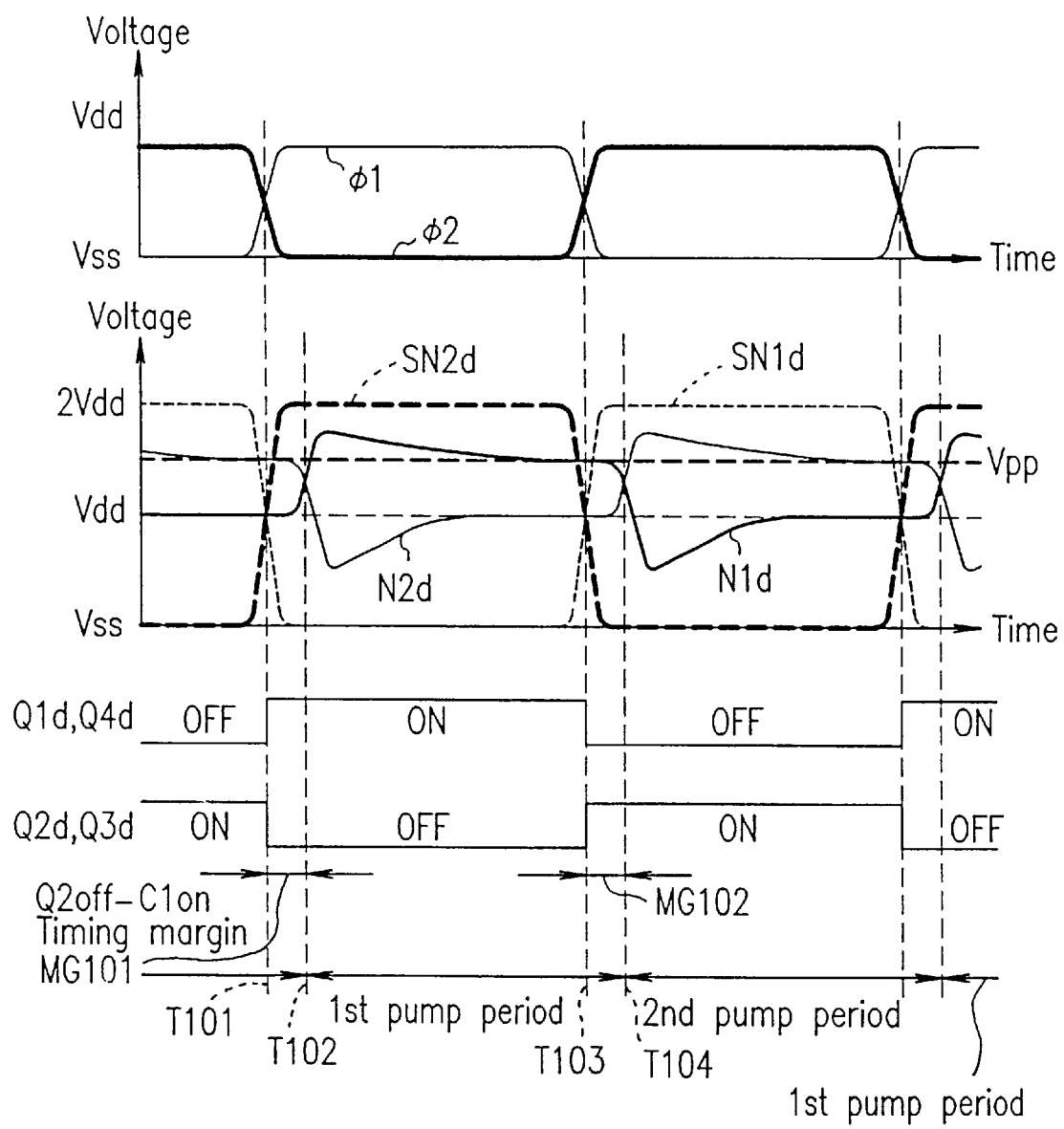
FIG. 10 is a waveform diagram illustrating the operational waveforms of the charge pump circuit shown in FIG. 9.

FIG. 9 is a circuit diagram illustrating a charge pump circuit according to Example 3 of the present invention. FIG. 10 is a waveform diagram illustrating the operational waveforms of the charge pump circuit shown in FIG. 9. In order to overcome the above-mentioned problem, the charge pump circuit according to the present example includes pump drivers 3*e* and 4*e* in addition to the structure described in Example 2.

The pump driver 3*e* includes complementary transistors 31*e* and 32*e* whose gates are interconnected and whose drains are interconnected. The pump driver 4*e* includes complementary transistors 41*e* and 42*e* whose gates are interconnected and whose drains are interconnected. The pump drivers 3*e* and 4*e* receive signals SN1*d* and SN2*d*, respectively, so as to drive the main capacitors C1*d* and C2*d*.

According to the present example, the signals φ1 and φ2 only need to drive the subcapacitors SC1*d* and SC2*d*, and do not need to drive the main capacitors C1*d* and C2*d*. As a result, the present example provides an advantage over Example 2 in that the drivers for generating the signals φ1 and φ2 have much less burden (due to reduced loading on the signals φ1 and φ2).

As described in Example 2, the output signals SN1*d* and SN2*d* of the subpump section 2*d* oscillate substantially within the range of Vss to 2Vdd. On the other hand, the pump drivers 3*e* and 4*e* have some delay time, which is inevitable for any semiconductor device.

As a result, by inputting signals SN1*d* and SN2*d* to the pump drivers 3*e* and 4*e* for driving the capacitors C1*d* and C2*d*, timing margins MG101 and MG102 (between the moment at which the transistors Q3*d* and Q4*d* are turned OFF and the moment at which the capacitors C1*d* and C2*d* are driven) are automatically secured between the time T101 and the time T102 and between the time T103 and the time T104, respectively (where the time T101 and the time T103 define points in time when the gate potentials of the rectification transistors Q1*d* and Q2*d* and the precharge transistors Q3*d* and Q4*d* of the main pump section 1*d* become stable; and the time T102 and the time T104 define points in time when the potentials of the nodes N1*d* and N2*d* change).

Thus, the present example provides a charge pump circuit which is capable of a potential elevation operation incurring an even smaller loss than in Example 2, without the need of complex controlling schemes.

Furthermore, since the signals SN1*d* and SN2*d* oscillate substantially within the range of Vss to 2 Vdd, the NMOS transistors Q1*d*, Q2*d*, Q3*d*, and Q4*d* can have low threshold values as shown in FIG. 9. The reason is that, even if the NMOS transistors have low threshold values, the gate potentials will be higher than the source potential by Vdd, thereby resulting in a reverse bias state, which effectively reduces the leakage current.

Although the structure illustrated in the present example includes the main pump section 1d, the pump drivers 3e and 4e, and the subpump section 2d, other structures can also be employed. For example, similar effects can be attained by only incorporating the main pump section 1d and the pump drivers 3e and 4e while omitting the subpump section 2d.

As described above, according to the present example, the operation speed of the pump drivers for driving the main pump section 1d can be increased, or the areas of the pump drivers can be reduced. This increases the operation speed of the entire charge pump circuit. Furthermore, a charge pump circuit occupying a small area while being capable of low-voltage operation can be realized.

EXAMPLE 4

Figure 11:
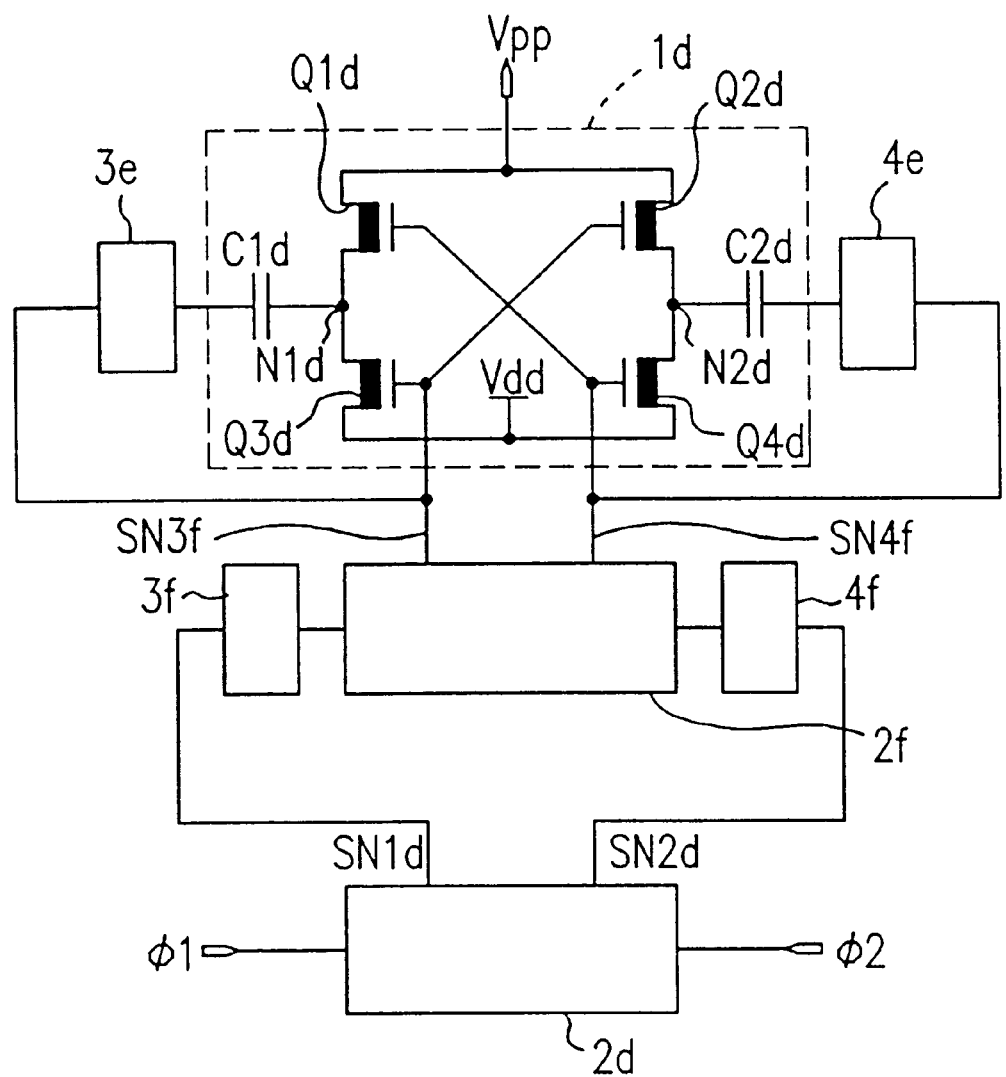
FIG. 11 is a circuit diagram illustrating a charge pump circuit according to Example 4 of the present invention.
Figure 12:
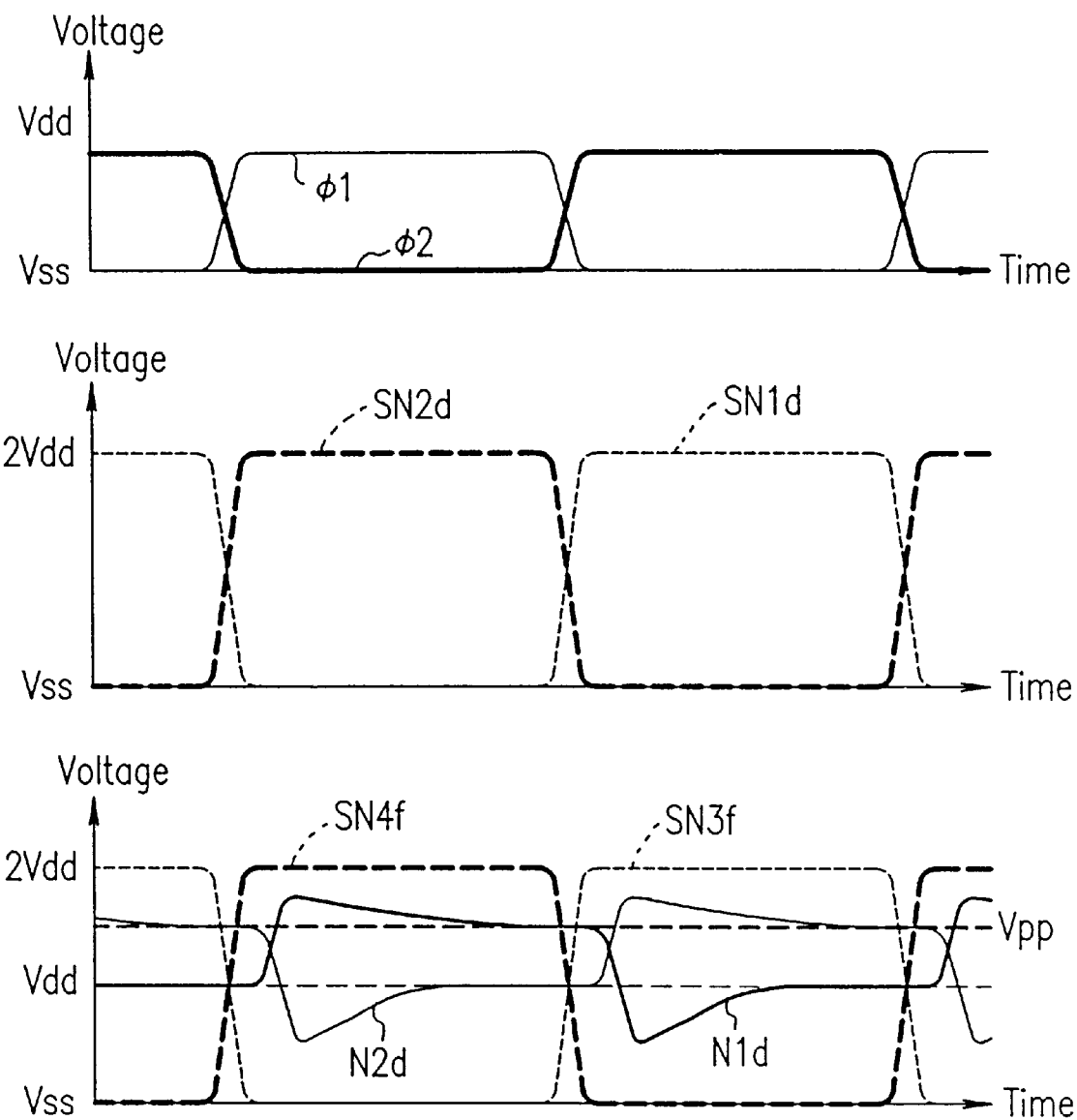
FIG. 12 is a waveform diagram illustrating the operational waveforms of the charge pump circuit shown in FIG. 11.

FIG. 11 is a circuit diagram illustrating a charge pump circuit according to Example 4 of the present invention. FIG. 12 is a waveform diagram illustrating the operational waveforms of the charge pump circuit shown in FIG. 11.

In Examples 1 to 3, the subpump section elevates the gate potential of the rectification transistors and the precharge transistors in the main pump section. However, in order to elevate the output of the subpump section to the vicinity of 2 Vdd, it is necessary to sufficiently increase the capacitance values of the subcapacitors in the subpump section relative to the values of the rectification transistors or other parasitic capacitances. In the case where a large current is required to drive the main pump section because of a large load being coupled to the output of the charge pump circuit, the size of the subpump section inevitably increases. This may prevent rapid operation of the subpump section under low voltage conditions where the input voltage Vdd is 1V or less, for example.

In order to overcome this problem, according to the present example, a first subpump section 2d drives a second subpump section 2f. As a result, the first subpump section 2d may have a driving power which is insufficient for driving the main pump section so long as the first subpump section 2d is capable of driving the second subpump section 2f.

In this case, the signals SN1d and SN2d output from the first subpump section 2d can generate a voltage in the range of Vss to 2 Vdd, so that the second subpump section can be overdriven as illustrated in FIG. 9. Accordingly, it is possible to prescribe the capacitance values of the subcapacitors in the first subpump section 2d to be larger than those of the subcapacitors in the second subpump section 2f.

Thus, the present example employs a number of subpump sections, so that the potentials of the signals SN1d and SN2d can be elevated to a value which is substantially equal to 2 Vdd even in the case where a large load is coupled to the main pump section. As a result, an elevated power level can be efficiently provided under low voltage conditions where the input voltage Vdd is 1 V or less.

The number of subpump sections employed according to the present example can be 2, 3, or more. Any number of subpump sections can be employed so long as the last subpump section (i.e., the one directly coupled to the main pump section) can easily drive the main pump sections and the signals φ1 and φ2 can easily drive the first subpump section.

The phases of the signals used in the last subpump section driving the main pump section will be shifted relative to those of the signals φ1 and φ2 by an amount corresponding to the number of subpump sections employed. Nonetheless, the main pump section is driven at a frequency which is equal to the frequency of the signals φ1 and φ2.

EXAMPLE 5

Figure 13:
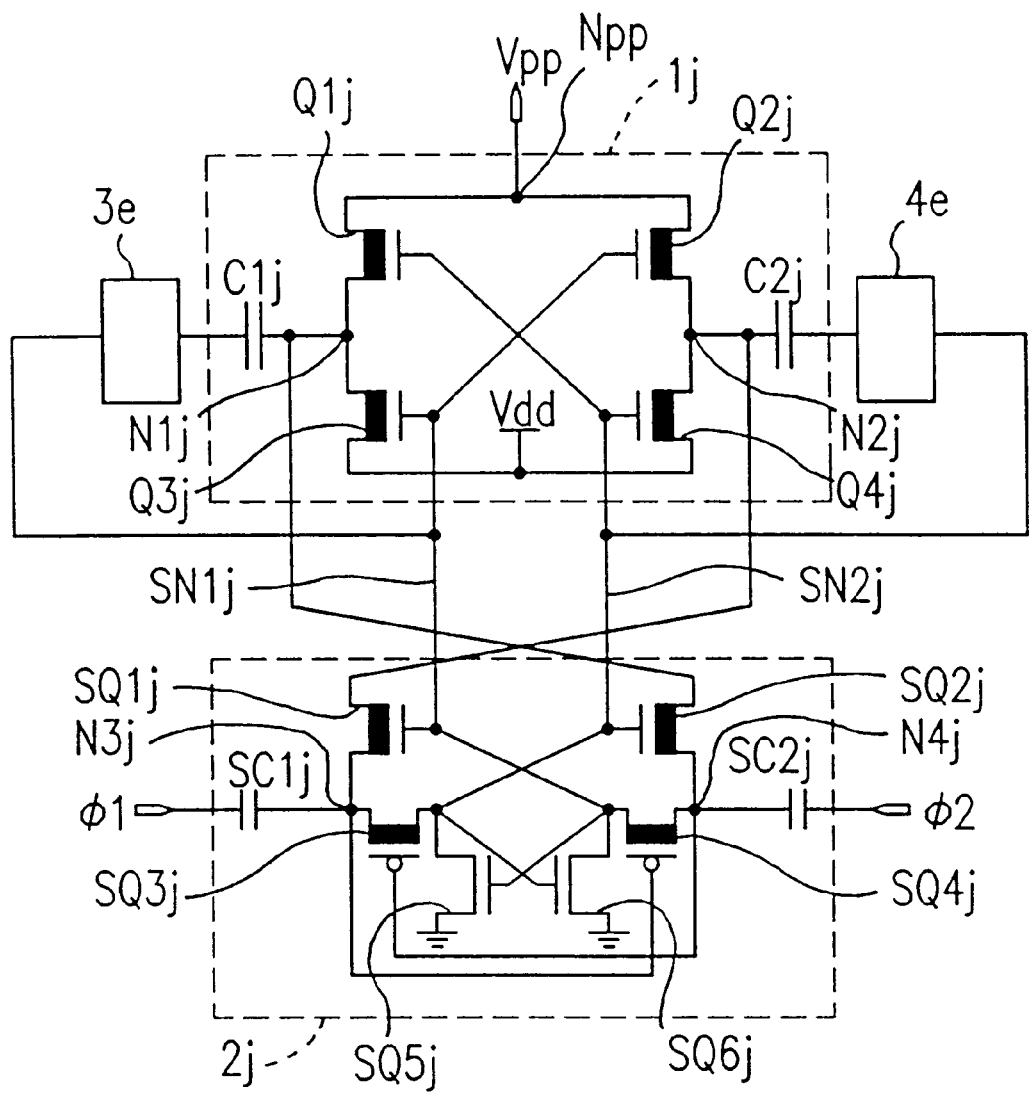
FIG. 13 is a circuit diagram illustrating a charge pump circuit according to Example 5 of the present invention.
Figure 14:
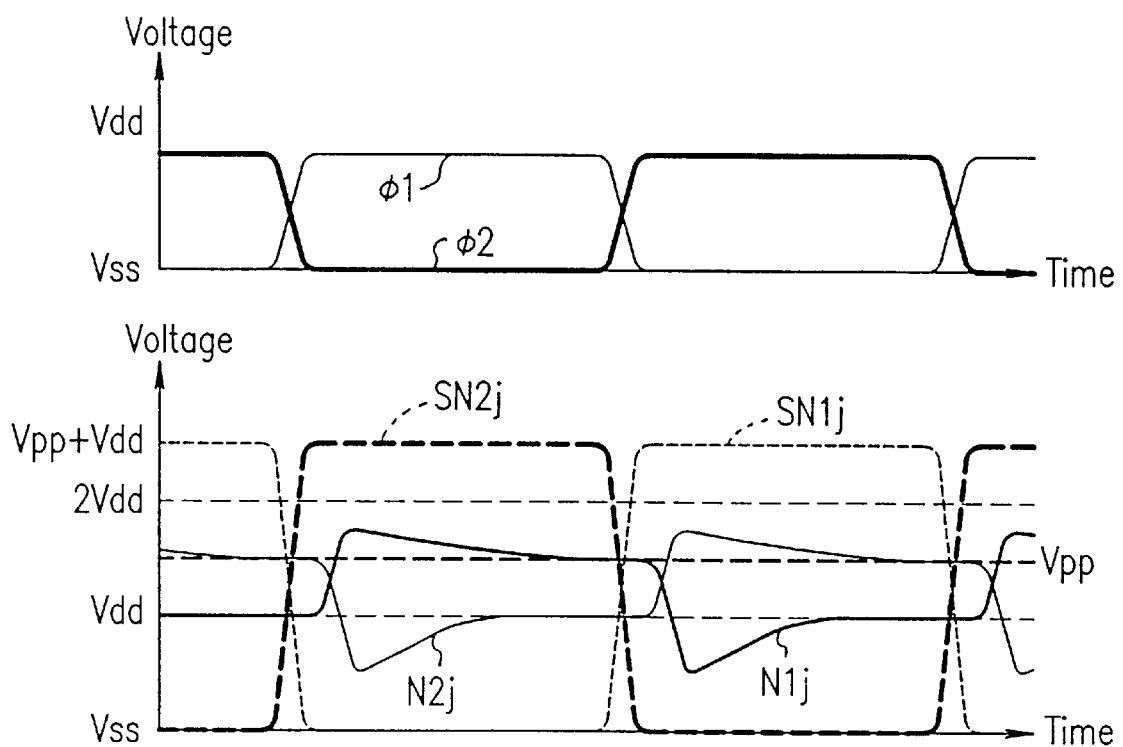
FIG. 14 is a waveform diagram illustrating the operational waveforms of the charge pump circuit shown in FIG. 13.

FIG. 13 is a circuit diagram illustrating a charge pump circuit according to Example 5 of the present invention. FIG. 14 is a waveform diagram illustrating the operational waveforms of the charge pump circuit shown in FIG. 13.

The subpump section in Example 2 is designed to generate an amplitude of Vss to 2 Vdd because the amplitude of Vss to 2 Vdd is sufficient for generating the appropriate gate voltages in the main pump section.

However, in some cases the input voltage Vdd may further decrease so that a voltage higher than 2 Vdd (or Vss to 2 Vdd) may be required to control the rectification transistors and the precharge transistors of the main pump section. Moreover, the driving power of a transistor increases as the difference in potential between the ON/OFF levels applied to the gate of the transistor increases. Therefore, the potential amplitude of the signals output from a subpump section for controlling the main pump section should be as large as possible.

As shown in FIG. 13, a node N3j is coupled to a node N2j via the transistor SQ1j and a node N4j is coupled to a node N1j via the transistor SQ2j so as to provide a subpump precharge power source. The nodes N3j and N4j are precharged at the voltage Vpp or higher. As a result, the potential amplitudes of the outputs SN1j and SN2j of the subpump section can be increased to between Vss and (Vdd+Vpp).

Thus, according to the present example, the amplitudes of the gate potentials of the rectification transistors Q1j and Q2j and precharge transistors Q3j and Q4j can be further increased by (Vpp−Vdd) as compared with those in Examples 2 to 4. As a result, the rate of charge transfer from the node N1j and the node N2j to the output node Npp can be further improved.

Figure 15:
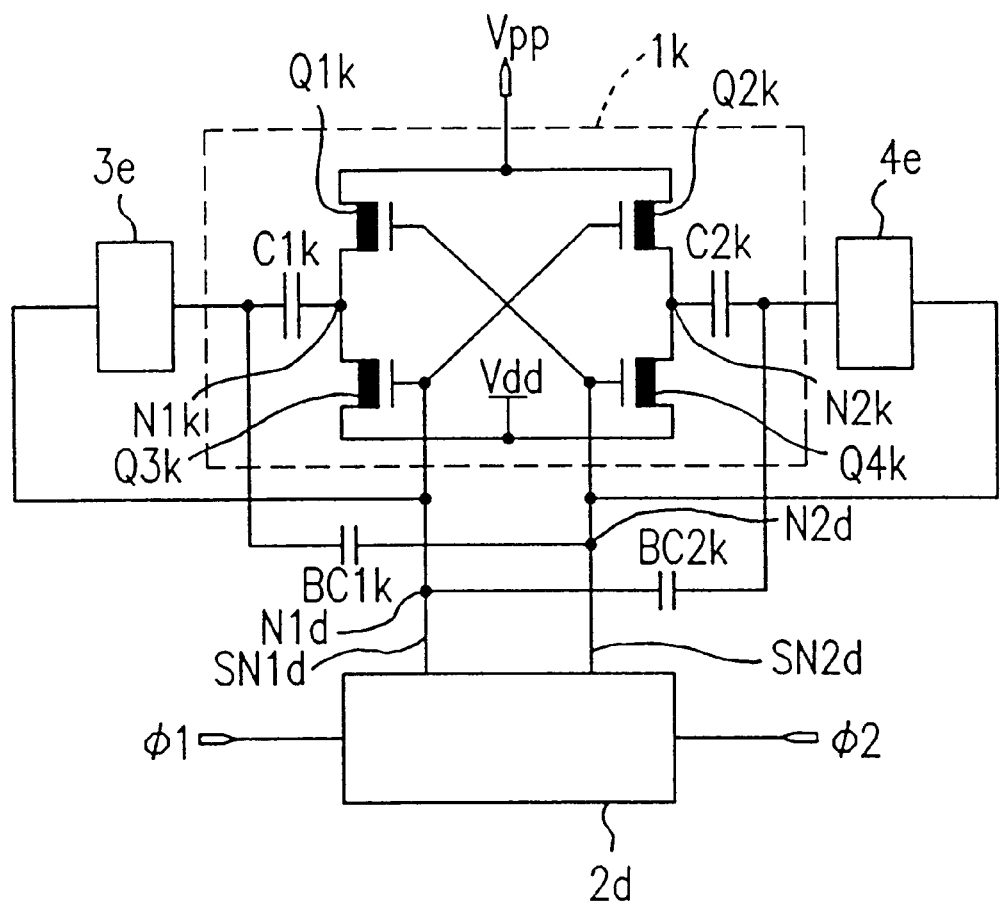
FIG. 15 is a circuit diagram illustrating a variant of the charge pump circuit according to Example 5 of the present invention.
Figure 16:
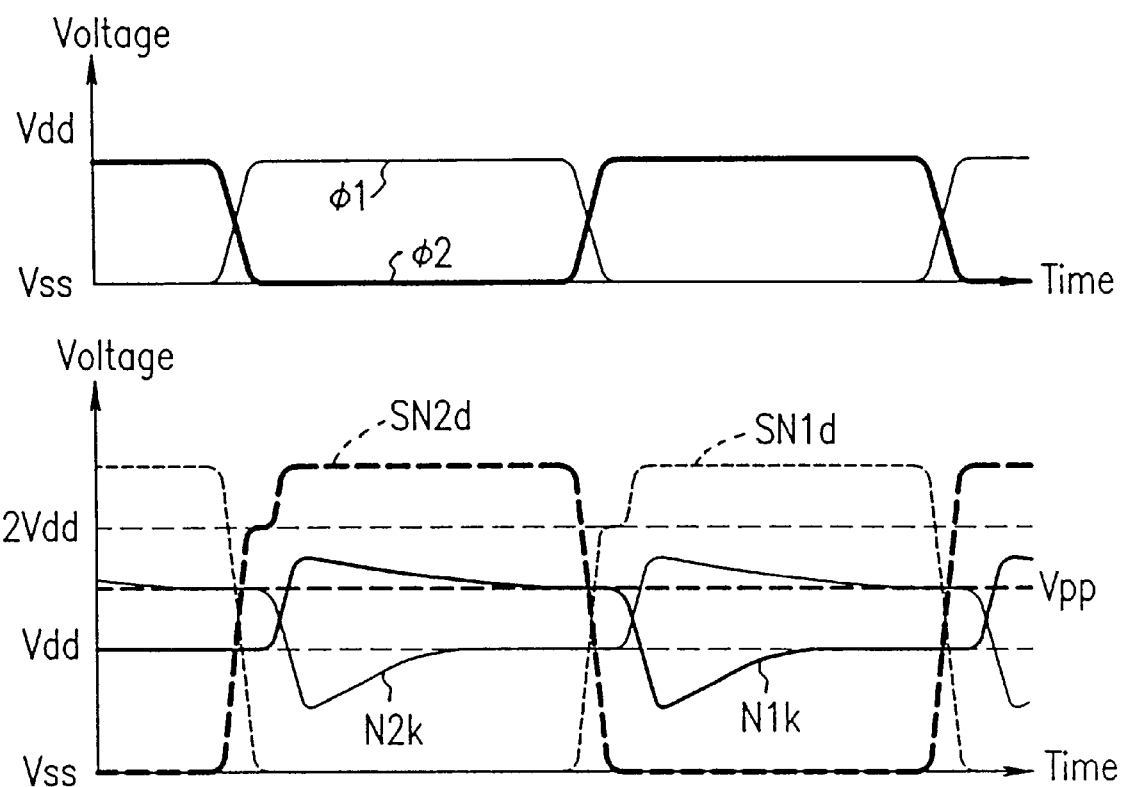
FIG. 16 is a waveform diagram illustrating the operational waveforms of the charge pump circuit shown in FIG. 15.

FIG. 15 is a circuit diagram illustrating a variant of the charge pump circuit according to Example 5 of the present invention. FIG. 16 is a waveform diagram illustrating the operational waveforms of the charge pump circuit shown in FIG. 15.

As shown in FIGS. 15 and 16, feedback capacitors BC1k and BC2k are provided between nodes N1k and N2d and between nodes N2k and N1d, respectively. After the potential of the node N1d or N2d has increased to 2Vdd, the capacitor C1k or C2k of the main pump section 1k is driven by the pump driver 3e or 4e with some delay. The feedback capacitors BC1k and BC2k are also driven at this time.

As a result, due to the capacitance coupling between the feedback capacitors BC1k and BC2k, the potentials of the nodes N1d and N2d further increase from 2 Vdd. Accordingly, the amplitudes of the gate potentials of the rectification transistors Q1k and Q2k and the precharge transistors Q3k and Q4k of the main pump section 1k can be increased above 2 Vdd.

EXAMPLE 6

There has been a desire for reduced power voltages for use within semiconductor circuits, due to the decrease in the power consumption of semiconductor circuits and the introduction of finer processing techniques.

However, a semiconductor circuit may locally include portions employing complicated logic operations such that signals cannot be conveyed to proper locations within a predetermined amount of time using the reduced power voltages. In such portions, the power voltage must be locally increased to ensure that the necessary signals will be properly conveyed within a predetermined amount of time. This has resulted in a need for a two-level power system for a semiconductor circuit.

The present invention pays attention to problems associated with the power consumption of each portion of a semiconductor circuit as well as the conversion loss during voltage conversion processes required for a two-level power system. According to the present invention, a voltage which is available before voltage conversion is supplied to portions with larger power consumption and a voltage resulting from voltage conversion is supplied to portions with smaller power consumption.

Figure 17A:
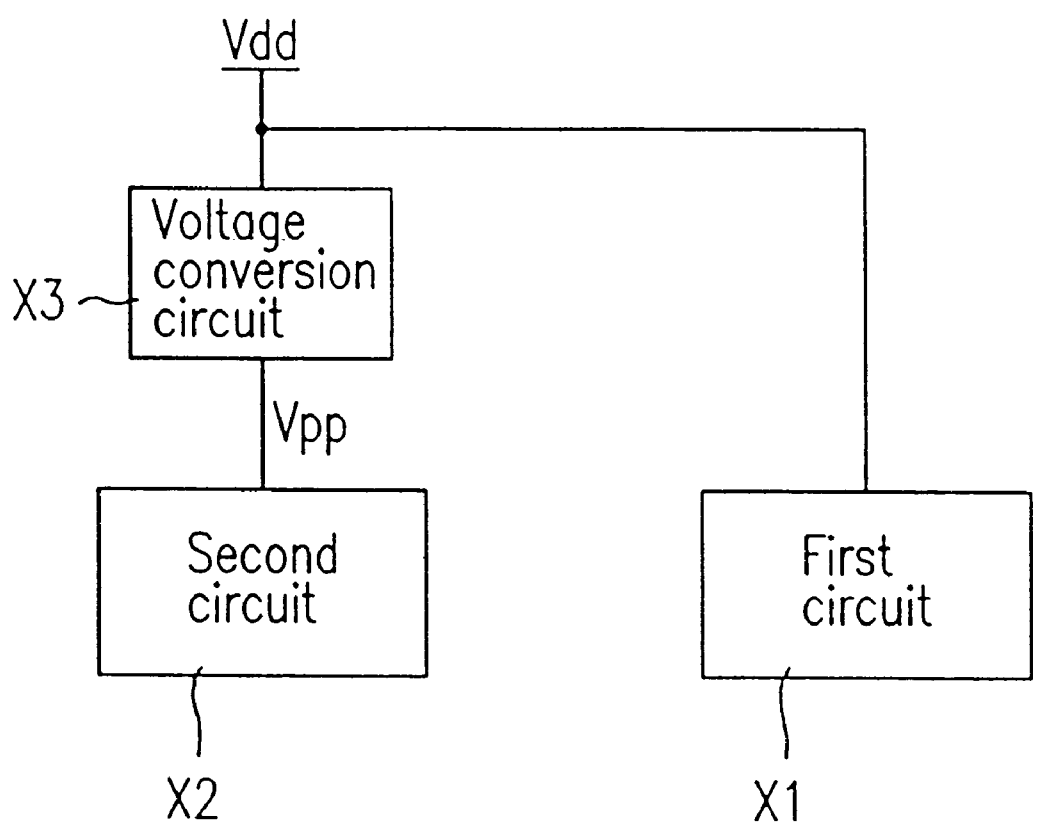
FIG. 17A is a diagram illustrating the principles of a logic circuit according to Example 6 of the present invention.

With reference to FIG. 17A, a semiconductor circuit is shown to include a first circuit X1, a second circuit X2, and a voltage conversion circuit X3, where the first circuit X1 consumes more power than the second circuit X2. The voltage conversion circuit X3 converts a power voltage Vdd to a voltage Vpp, where the voltage Vpp is either higher than the power voltage Vdd or lower than a ground potential Vss. The voltage conversion in the voltage conversion circuit X3 is accompanied by some conversion loss. The voltage Vpp (susceptible to some conversion loss) is supplied to the second circuit X2 having smaller power consumption than that of the first circuit X1, whereas the power voltage Vdd before conversion is supplied to the first circuit X1 having larger power consumption than that of the second circuit X2.

Since the second circuit X2 receiving the voltage Vpp (which is susceptible to some conversion loss) has smaller power consumption than that of the first circuit X1, the power loss will not be enlarged in the second circuit X2. As a result, the power loss in the overall semiconductor circuit due to such conversion loss is reduced. Thus, it becomes possible to reduce the power consumption of the overall semiconductor circuit.

The voltage conversion circuit X3 can be formed on the same chip as the first circuit X1 and the second circuit X2. Alternatively, the voltage conversion circuit X3 can be provided externally to the chip on which the first circuit X1 and the second circuit X2 are formed.

The voltage conversion circuit X3 can be any voltage conversion circuit that is capable of converting the power voltage Vdd to the voltage Vpp. For example, the voltage conversion circuit X3 can be a conventional charge pump circuit or DC/DC convertor.

Furthermore, any of the charge pump circuits illustrated in Examples 1 to 5 can be employed as the voltage conversion circuit X3. In such cases, advantages are provided in that the conversion loss in the conversion of the power voltage Vdd to the voltage Vpp can be reduced, and that the voltage conversion circuit X3 can operate under low voltage conditions where the input voltage Vdd is 1 V or less.

There can be various causes for the assumed relatively larger power consumption of the first circuit X1 over the second circuit X2. For example, the switching in the first circuit X1 may occur at a higher frequency than the switching in the second circuit X2. Alternatively, the first circuit X1 may be required to drive a larger load than the load driven by the second circuit X2.

Hereinafter, a case will be illustrated where the first circuit X1 drives a larger load than the load driven by the second circuit X2. The same discussion will apply to the case where the switching in the first circuit X1 occurs at a higher frequency than the switching in the second circuit X2.

Figure 17B:
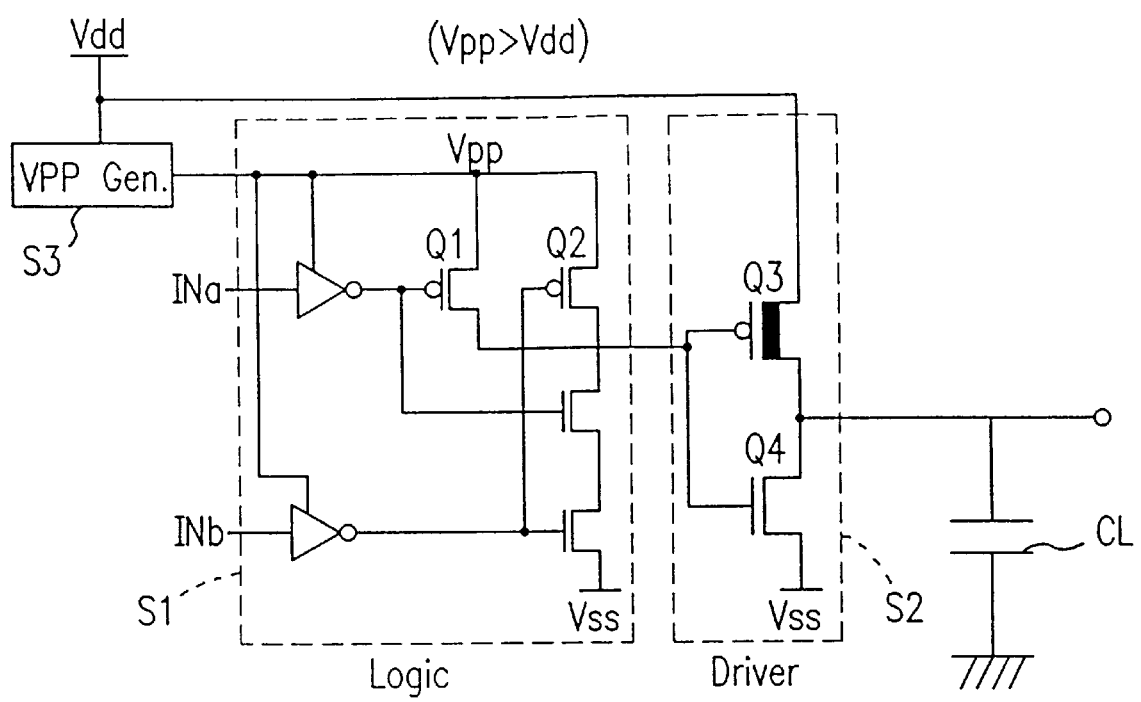
FIG. 17B is a circuit diagram illustrating a logic circuit according to Example 6 of the present invention incorporating a charge pump circuit for generating an elevated power level.

FIG. 17B is a circuit diagram illustrating a logic circuit according to Example 6 of the present invention incorporating a charge pump circuit for generating an elevated power level.

The logic circuit includes a logic circuit section S1, a driver section S2, a charge pump circuit S3, and a load CL. The logic circuit section S1 includes PMOS transistors Q1 and Q2. The driver section S2 includes a PMOS transistor Q3 and an NMOS transistor Q4.

Since the driver section S2 drives the load CL, which is larger than the load to be driven by the logic circuit section S1, the driver section S2 has a larger power consumption than that of the logic circuit section S1. Hence, the power voltage Vdd before voltage conversion is supplied to the driver section S2 according to the present invention.

The elevated voltage Vpp resulting after the voltage conversion is supplied to the logic circuit section S1, which is required to be capable of rapid operation. Since the load of the logic circuit section S1 is smaller than the load of the driver section S2, the conversion loss will not be expanded in the logic circuit section S1 despite the possible conversion loss inherent in the elevated voltage Vpp being supplied to the logic circuit section S1. As a result, the power loss due to conversion loss is reduced in the entire logic circuitry.

Thus, the power consumption of the entire logic circuitry can be reduced by supplying the power voltage Vdd to the driver section S2 and the elevated voltage Vpp to the logic circuit section S1.

Moreover, the operation speed of the entire logic circuitry is increased. Specifically, the logic circuit section S1 rapidly operates with the supply of the elevated voltage Vpp, whereas the driver section S2 rapidly operates due to the use of a low-threshold PMOS transistor Q3 (it is described in Example 2 how the use of low-threshold transistors effectively increases the operation speed of a semiconductor circuit).

However, transistors with excessively low threshold values tend to have large leakage currents, ultimately resulting in an increase in the operation current. This may ruin the purpose of adopting the voltage before conversion for smaller power consumption; in fact, the power consumption of a circuit may increase due to such leakage currents.

In accordance with the logic circuit of Example 6 of the present invention, the leakage current can be minimized even in the case of employing low-threshold PMOS transistors, as described below.

The logic circuit section S1 outputs either the elevated voltage Vpp or the ground potential Vss to the driver section S2. The elevated voltage Vpp or the ground potential Vss is applied to the respective gates of a PMOS transistor Q3 and an NMOS transistor Q4.

When the elevated voltage Vpp is output to the driver section S2, the PMOS transistor Q3 provided in the driver section S2 is turned OFF, whereas the NMOS transistor Q4 is turned ON. As a result, the ground potential Vss is output from the driver section S2.

When the ground potential Vss is output to the driver section S2, the PMOS transistor Q3 provided in the driver section S2 is turned ON, whereas the NMOS transistor Q4 is turned OFF. As a result, the power voltage Vdd is output from the driver section S2.

The power voltage Vdd is supplied to the source of the PMOS transistor Q3. The PMOS transistor Q3 is turned OFF when the elevated voltage Vpp is supplied to the gate of the PMOS transistor Q3. Accordingly, the PMOS transistor Q3 is in a reverse bias state during the OFF state of the PMOS transistor Q3.

Due to the reverse bias state of the PMOS transistor Q3 in an OFF state, it becomes possible to prescribe the threshold value of the PMOS transistor Q3 at a lower value than in the case where the power voltage Vdd is supplied to the source of the PMOS transistor Q3 so that the PMOS transistor Q3 is turned OFF with the power voltage Vdd being supplied to the gate of the PMOS transistor Q3.

Thus, according to the present invention, the leakage current is minimized due to the reverse bias state of the low-threshold transistor Q3 in an OFF state.

For example, assuming that a power voltage Vdd of 0.5 V is supplied to the source of the PMOS transistor Q3 and an elevated voltage Vpp of 0.75 V is supplied to the gate of the PMOS transistor Q3 so as to place the PMOS transistor Q3 in an OFF state, the gate-source voltage Vgs of the PMOS transistor Q3 during an OFF state is 0.25 V.

In general, it is considered that the leakage current of a PMOS transistor does not increase to an unacceptable value if (Vgs–Vt) is equal to or greater than 0.1 V (Proceedings of SEMICON/Kansai 96 ULSI Technology Seminar, 1-48 to 1-49; and ISSCC96/SESSION 10/LOW-POWER & COMMUNICATION SIGNAL PROCESSING/PAPER FA 10.3).

The operation current is defined as a sum of a charge/discharge current and a leakage current. Thus, if (Vgs–Vt) is equal to or greater than 0.1 V, the leakage current does not account for a large portion in the operation current so that the leakage current will not greatly increase the operation current.

Thus, the threshold value Vt of the PMOS transistor Q3 can be prescribed at a very low value, e.g., +0.15 V.

Herein, the threshold value of an NMOS transistor is regarded as decreasing as its positive value decreases. On the other hand, the threshold value of a PMOS transistor is regarded as decreasing as its positive value increases, in the opposite direction of NMOS transistors. Accordingly, the following description will use the above-defined convention.

For comparison, in a conventional structure where a power voltage Vdd of 0.5 V is supplied to the source and the gate of the PMOS transistor Q3 to place the PMOS transistor Q3 in an OFF state, the PMOS transistor Q3 in an OFF state has a gate-source voltage Vgs of 0 V. Under the gate-source voltage Vgs=0 V, the threshold value Vt of the PMOS transistor must be prescribed at −0.1 V in order to maintain the value of (Vgs–Vt) equal to or greater than 0.1 V.

Thus, in the conventional structure, the threshold value Vt of the PMOS transistor Q3 can only be reduced to −0.1 V. On the other hand, in the structure according to the present example, it is possible to reduce the threshold value Vt to +0.15 V, which is the lowest value of the threshold value Vt.

However, the present invention does not require the threshold value Vt to be reduced to +0.15 V. The threshold value Vt according to the present invention can be prescribed at any value within the range of −0.1 V to +0.15 V. Any value of the threshold value Vt within this range will be smaller than the conventional threshold value.

As will be appreciated, the structure according to the present example allows the use of a threshold value which is 0.25 V lower than that used in the conventional example without increasing the leakage level. Thus, since the PMOS transistor Q3 has a low threshold value, the PMOS transistor Q3 rapidly switches from an OFF state to an ON state as the ground potential Vss is supplied to the gate of the transistor Q3.

On the other hand, the gate-source voltage of the NMOS transistor Q4 in an OFF state is 0 V because its gate voltage and source voltage in an OFF state are Vss. It is generally considered that the leakage current of an NMOS transistor does not greatly increase the operation current if (Vgs–Vt) is equal to or smaller than −0.1 V.

Although it is therefore impossible to reduce the threshold value Vt to 0.1 V or less (otherwise Vgs–Vt>−0.1 V, an undesirable condition), the gate-source voltage Vgs is Vpp=0.75 V, so that a (Vgs–Vt) value which is greater than the power voltage Vdd (i.e., 0.5 V) is applied without particularly lowering the threshold voltage. Thus, due to the high gate-source voltage Vgs in an ON state, the NMOS transistor Q4 rapidly switches from an OFF state to an ON state.

Thus, the PMOS transistor Q3 and the NMOS transistor Q4 in the driver section S2 can rapidly switch between ON and OFF states, thereby allowing rapid operation of the driver section 2.

On the other hand, low threshold values of the PMOS transistors Q1 and Q2 in the logic circuit section S1 would cause incomplete OFF states of the PMOS transistors Q1 and Q2, thereby increasing the leakage current. This hinders the purpose of supplying the elevated voltage Vpp from the charge pump circuit S3, i.e., realizing rapid operation and small power consumption. Therefore, in order to ensure small power consumption, the threshold values of the PMOS transistors Q1 and Q2 in the logic circuit section S1 are preferably prescribed at higher values than that of the PMOS transistor Q3 in the driver section 2.

However, low-threshold transistors similar to the PMOS transistor Q3 can suitably be used for some PMOS transistors (other than the PMOS transistors Q1 and Q2) in the logic circuit section S1 (the use of an excessively large number of low-threshold transistors should be avoided) because a small number of low-threshold transistors may only result in a negligible leakage current not exceeding an allowable range.

As described above, a low-threshold transistor is employed for the PMOS transistor Q3 in the driver section S2 for driving a large load, while transistors with standard threshold values are employed for the transistors other than the PMOS transistor Q3. The gate delay in the logic circuit section S1 can be minimized by the application of the elevated power level Vpp output from the charge pump circuit S3.

Although the above-described example illustrates a case where the power voltage Vdd is converted to a voltage Vpp which is higher than the power voltage Vdd so that the voltage Vpp is employed as a power voltage for the logic circuit section S1, similar effects can be attained by converting the power voltage Vss to a voltage Vss' which is lower than the ground voltage Vss and employing the voltage Vss' as a ground voltage for the logic circuit section S1. In this case, the threshold value of the NMOS transistor Q4 in the driver circuit S2 can be prescribed at a low value.

It is also applicable to convert the power voltage Vdd to a voltage Vpp which is higher than the power voltage Vdd and convert the power voltage Vss to a voltage Vss' which is lower than the ground voltage Vss so that both the voltage Vpp and the voltage Vss' are used in combination. In this case, the threshold values of the PMOS transistor Q3 and the NMOS transistor Q4 in the driver circuit S2 can be both prescribed at low values.

As described above, according to the present invention, a charge pump circuit with a small voltage conversion loss is provided.

Moreover, according to the present invention, a high-efficiency charge pump circuit capable of rapidly supplying an elevated or a lowered power level under low voltage conditions of an input voltage being 1 V or less is provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A charge pump circuit comprising a first pump section, the first pump section including:

a first switching element which includes a first rectification transistor and a second rectification transistor;

a second switching element which includes a first precharge transistor and a second precharge transistor;

a first node which is coupled to the first switching element via a first capacitor; and a second node which is coupled to the second switching element via a second capacitor, wherein the charge pump circuit converts an input voltage to an output voltage by complementary action of the first switching element and the second switching element responsive to a first driving voltage signal and a second driving voltage signal, respectively, the output voltage being output via an output terminal, the first rectification transistor and the second rectification transistor respectively have a first rectification control terminal and a second rectification control terminal, the first precharge transistor and the second precharge transistor respectively have a first precharge control terminal and a second precharge control terminal, the first node, the second node and the output terminal are electrically isolated from the first and second rectification control terminals and the first and second precharge control terminals, and the first and second rectification control terminals and the first and second precharge control terminals each receive a voltage having an amplitude which swings over a range that is greater than an amplitude of the input voltage.

2. A charge pump circuit according to claim 1, wherein while the charge pump circuit is in a first state, the first rectification transistor supplies charge stored in the first capacitor to the output terminal and the second precharge transistor supplies the input voltage to the second capacitor; and while the charge pump circuit is in a second state, the second rectification transistor supplies charge stored in the second capacitor to the output terminal and the first precharge transistor supplies the input voltage to the first capacitor.

3. A charge pump circuit according to claim 2, wherein the charge pump circuit further comprises a second pump section for driving the first and second rectification control terminals and the first and second precharge control terminals;

the second pump section includes a first subtransistor, a second subtransistor, a first subcapacitor, and a second subcapacitor;

the first subtransistor and the second subtransistor have a first subcontrol terminal and a second subcontrol terminal, respectively;

a first group of control terminals includes the first rectification control terminal, the second precharge control terminal, and the second subcontrol terminal receives the first driving voltage signal via the first subcapacitor; and a second group of control terminals includes the second rectification control terminal, the first precharge control terminal, and the first subcontrol terminal receives the second driving voltage signal via the second subcapacitor.

4. A charge pump circuit according to claim 3, wherein the second pump section further includes means for generating a first voltage for ensuring that the first switching element and the second switching element are substantially in an OFF state;

the first group of the control terminals receives a second voltage in the first state and receives the first voltage in the second state, the second voltage being higher than the input voltage;

the second group of control terminals receives the first voltage in the first state and receives the second voltage in the second state; and the first and second rectification and precharge control terminals driven by the second pump section discharge at a voltage lower than the voltage in the second state.

* * * * *